(12) United States Patent
Ogawa

(10) Patent No.: US 9,840,592 B2
(45) Date of Patent: Dec. 12, 2017

(54) CURABLE RESIN COMPOSITION AND OPTICAL SEMICONDUCTOR DEVICE

(71) Applicant: HOYA CANDEO OPTRONICS CORPORATION, Toda-shi, Saitama (JP)

(72) Inventor: Shinichi Ogawa, Toda (JP)

(73) Assignee: HOYA CANDEO OPTRONICS CORPORATION, Toda-Shi, Saitama (JP)

( * ) Notice: Subject to any disclaimer, the term of this patent is extended or adjusted under 35 U.S.C. 154(b) by 0 days.

(21) Appl. No.: 15/073,713

(22) Filed: Mar. 18, 2016

(65) Prior Publication Data

US 2016/0280860 A1 Sep. 29, 2016

(30) Foreign Application Priority Data

Mar. 27, 2015 (JP) ................. 2015-067655
Sep. 11, 2015 (JP) ................. 2015-180235

(51) Int. Cl.

| C08G 77/04 | (2006.01) |
|---|---|
| C08G 77/08 | (2006.01) |
| H01L 33/56 | (2010.01) |
| C08G 77/18 | (2006.01) |
| C08K 5/057 | (2006.01) |
| C08K 3/32 | (2006.01) |

(52) U.S. Cl.

CPC ............ *C08G 77/04* (2013.01); *C08G 77/08* (2013.01); *H01L 33/56* (2013.01); *C08G 77/18* (2013.01); *C08K 5/057* (2013.01); *C08K 2003/329* (2013.01); *H01L 2224/48091* (2013.01); *H01L 2224/49107* (2013.01); *H01L 2224/8592* (2013.01); *H01L 2924/181* (2013.01)

(58) Field of Classification Search

CPC ........ C08G 77/04; C08G 77/08; C08G 77/18; H01L 33/56
USPC ........................................... 257/100
See application file for complete search history.

(56) References Cited

U.S. PATENT DOCUMENTS

2012/0168781 A1* 7/2012 Chun ................ H01B 1/22
257/88
2016/0340474 A1* 11/2016 Yoshikawa ............ C08L 83/04

FOREIGN PATENT DOCUMENTS

| JP | 2003-176334 A | 6/2003 |
|---|---|---|
| JP | 2003-277473 A | 10/2003 |
| JP | 2010-059359 A | 3/2010 |

* cited by examiner

*Primary Examiner* — Fernando L Toledo
*Assistant Examiner* — Adam S Bowen
(74) *Attorney, Agent, or Firm* — Rabin & Berdo, P.C.

(57) ABSTRACT

A curable resin composition having high transparency in the UV region, UV resistance and heat resistance. The curable resin composition includes an alkoxy oligomer represented by Formula 1 of $(R^1R^2R^3SiO_{1/2})_w(R^4R^5SiO_{2/2})_x(R^6SiO_{3/2})_y(SiO_{4/2})_z$ and a curing catalyst. The curing catalyst is phosphoric acid present in an amount of 3-30 parts by weight based on 100 parts by weight of the alkoxy oligomer, or alkoxide of at least one metal selected from the group consisting of B, Al, P, Sc, Ga, Y, Zr, Nb, In, Sn, La, Gd, Dy, Yb, Hf, Ta and W, present in an amount of 0.5-20 parts by weight based on 100 parts by weight of the alkoxy oligomer. Each of $R^1$, $R^2$, $R^3$, $R^4$, $R^5$ and $R^6$ independently represents the same or a different organic group, w, x, y and z are 0 or positive numbers satisfying the relationship of $w+x+y+z=1$, and the atomic ratio of O/Si is 2.3-3.5.

20 Claims, 11 Drawing Sheets

【Fig. 1】
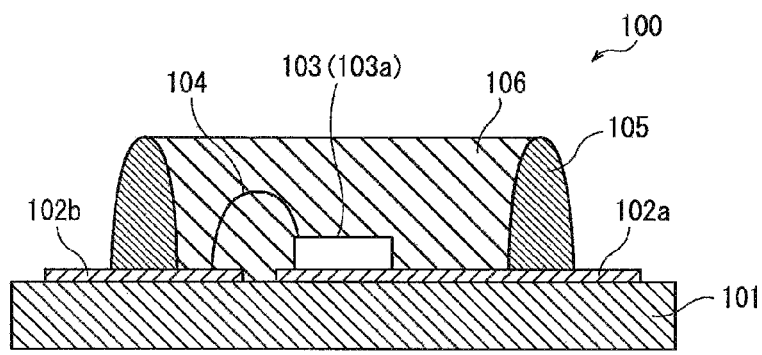
【Fig. 2】
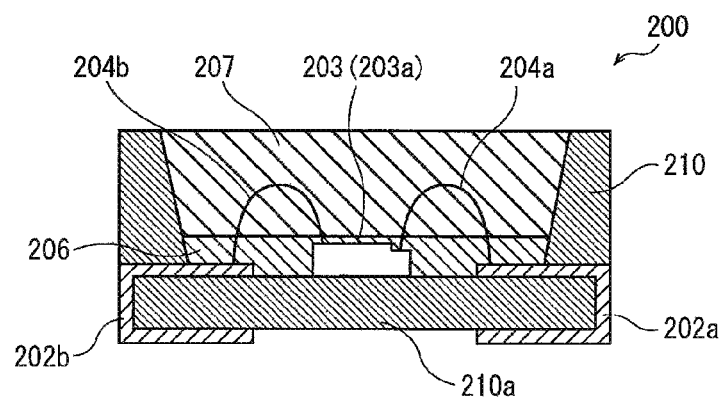

[Fig. 3]
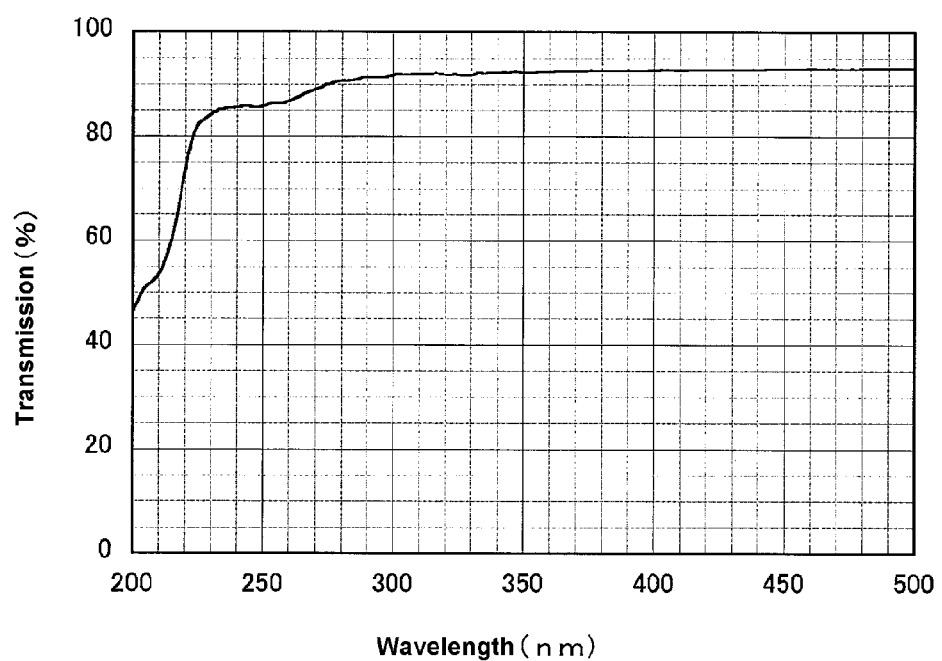

[Fig. 4]
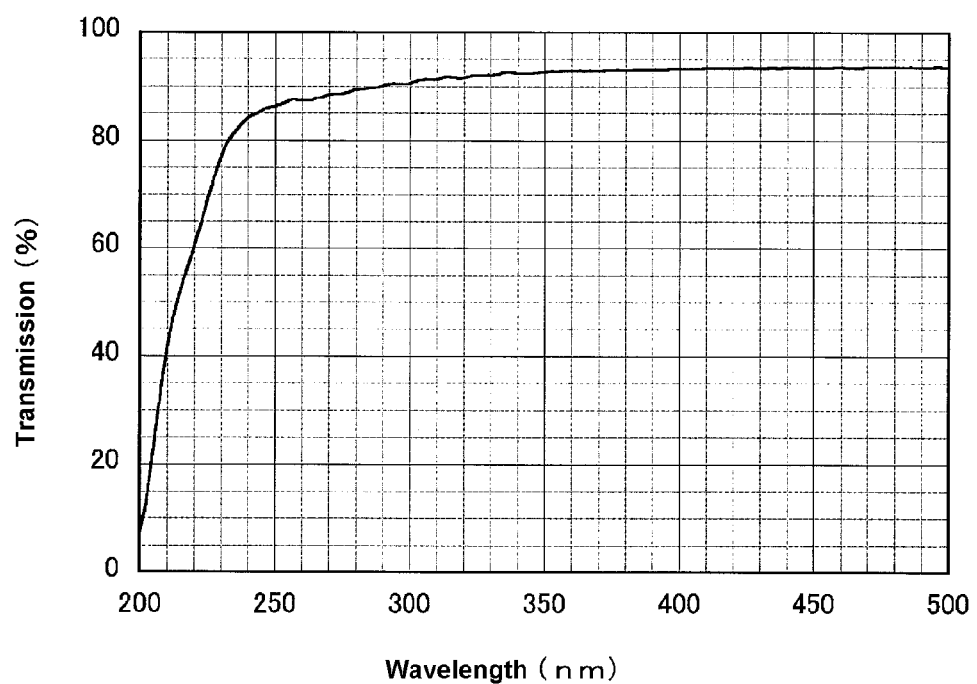

[Fig. 5]
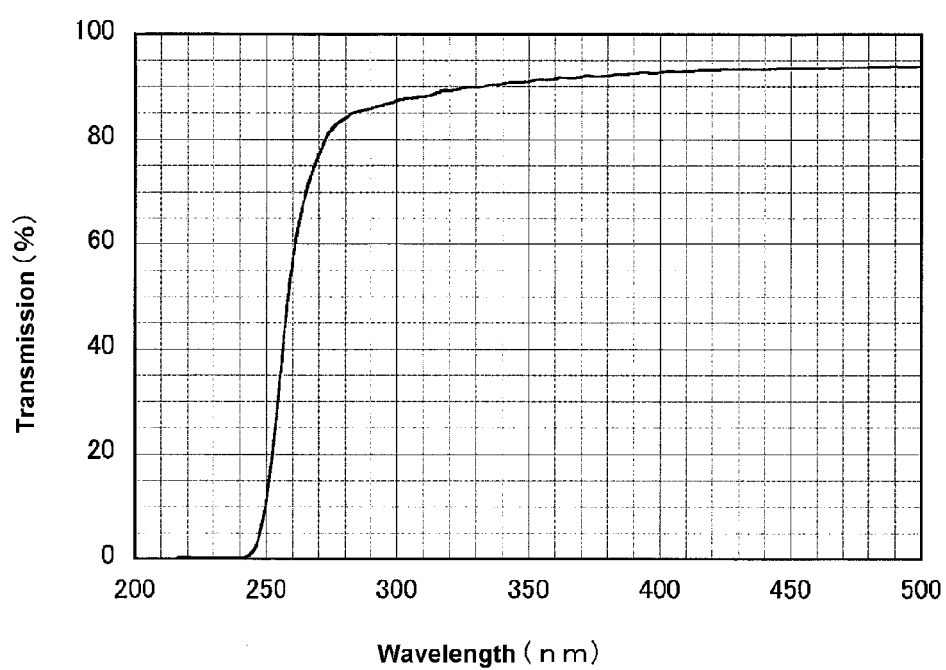

[Fig. 6]
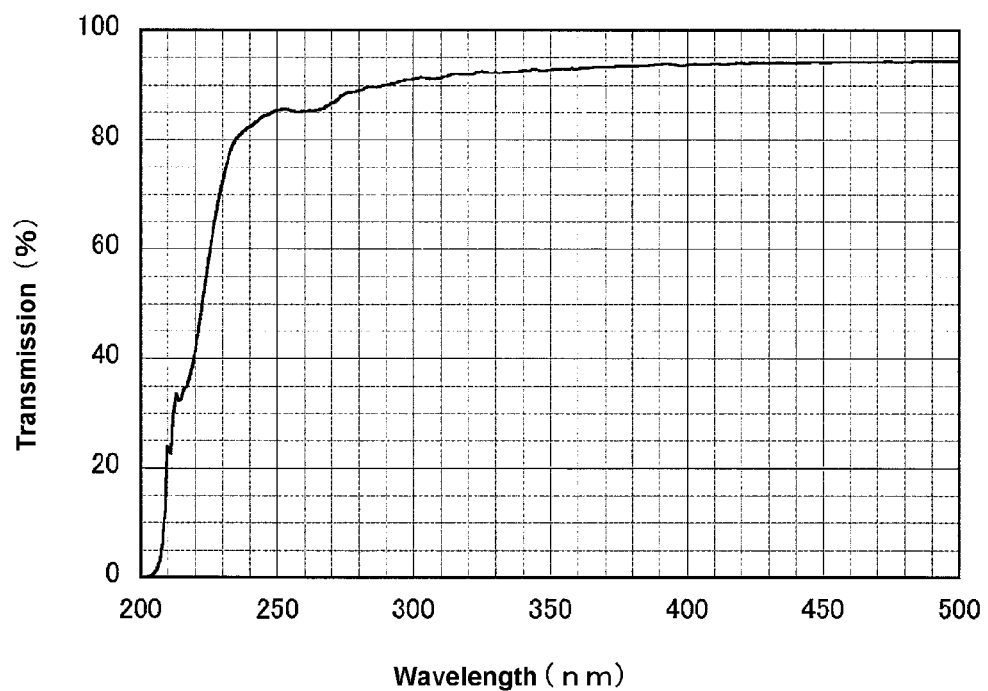

[Fig. 7]
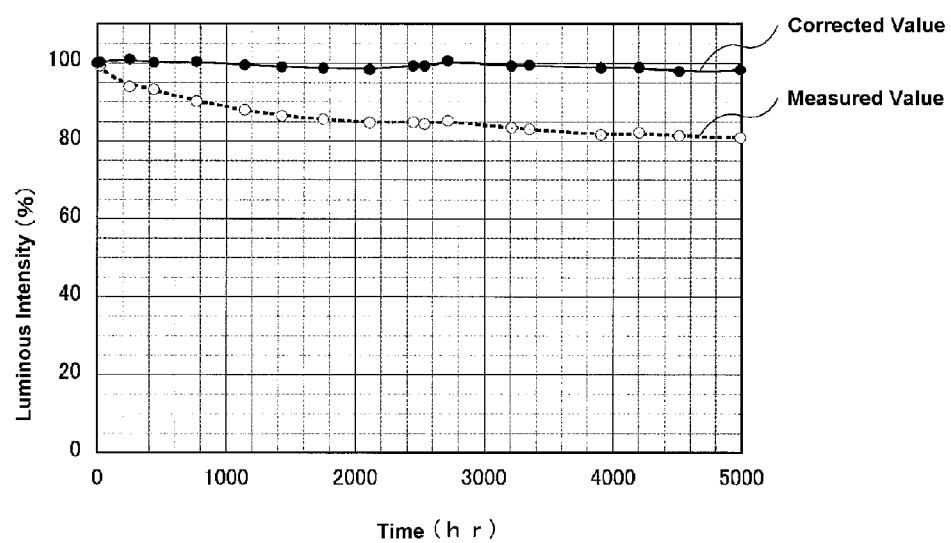

[Fig. 8]
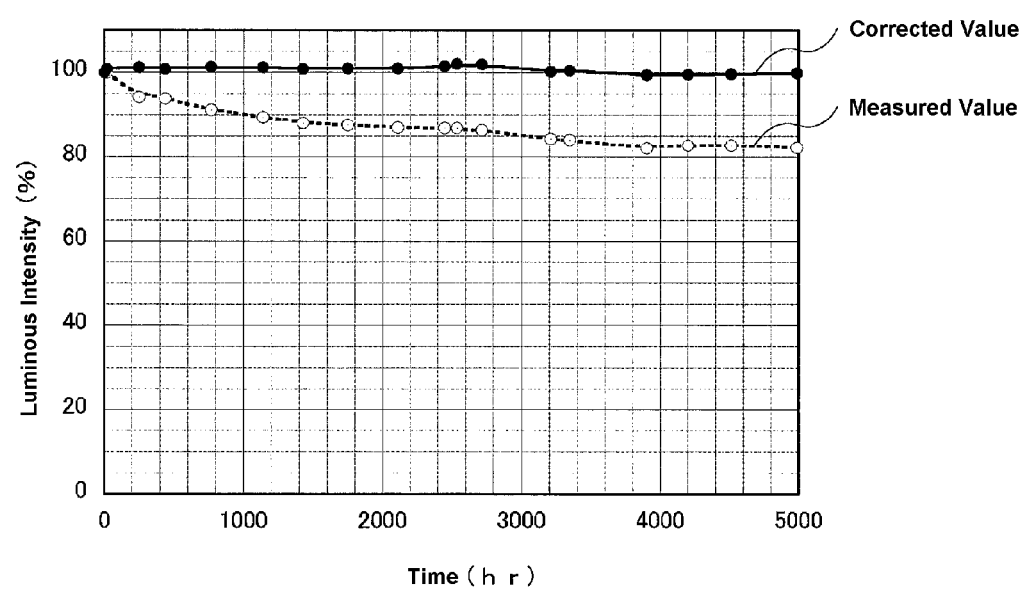

[Fig. 9]
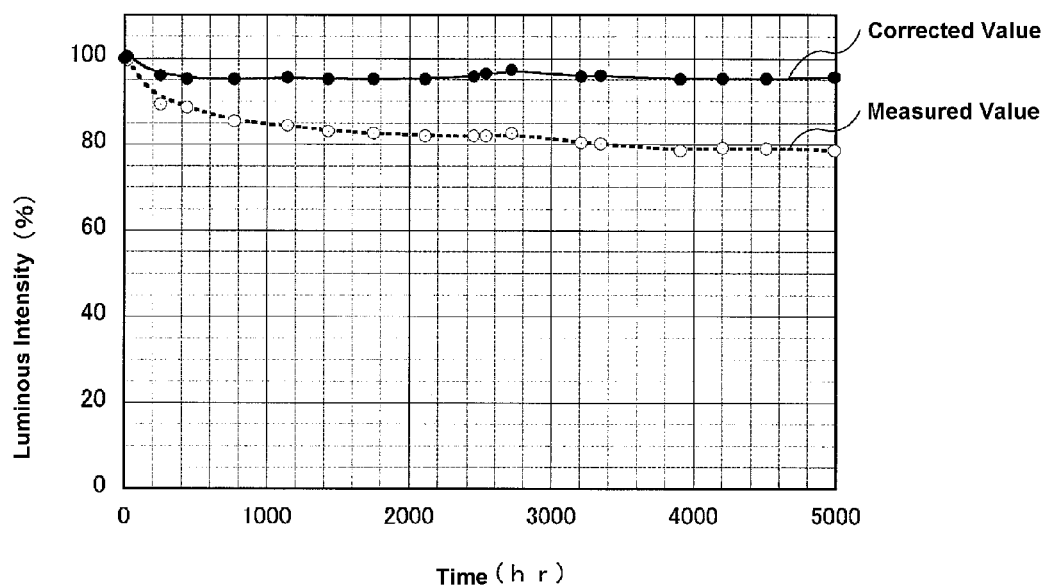

[Fig. 10]
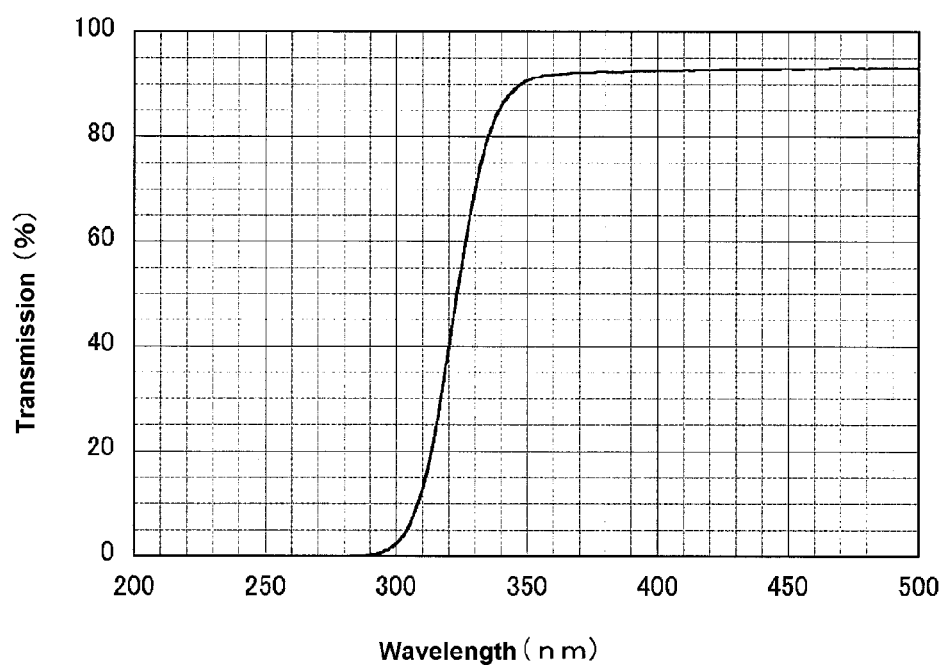

[Fig. 11]
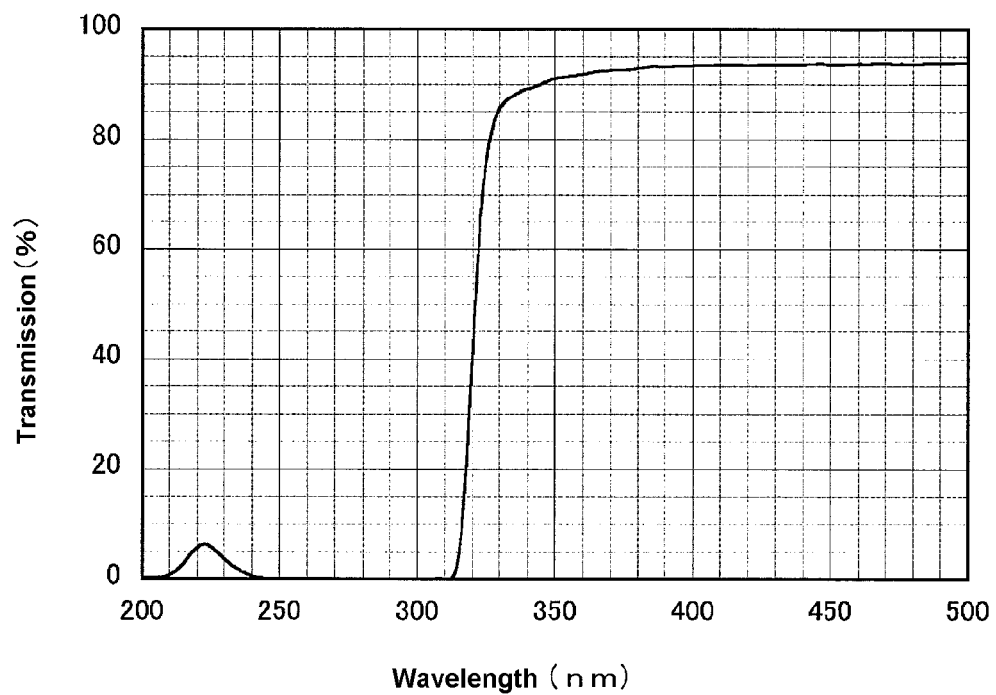

[Fig. 12]
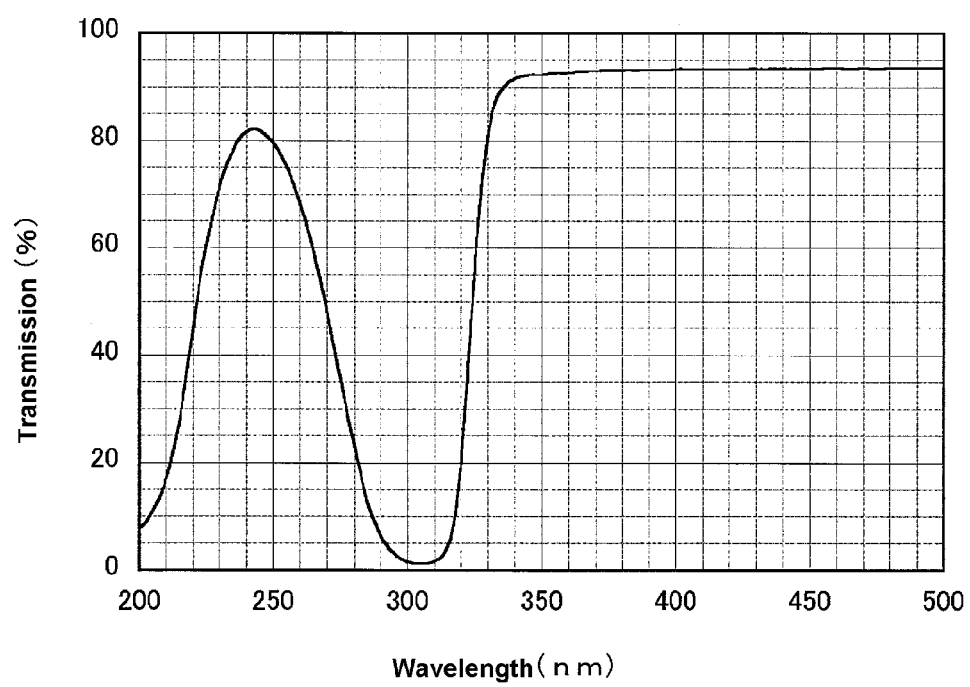

CURABLE RESIN COMPOSITION AND OPTICAL SEMICONDUCTOR DEVICE

TECHNICAL FIELD

The present invention relates to a curable resin composition having high light transmission in a wavelength region of ultraviolet (UV) rays, high UV resistance and high heat resistance, and an optical semiconductor device (such as UV light emitting diode (LED) using the curable resin composition.

BACKGROUND ART

Recently, a light emitting diode (LED) that emits the light with a short wavelength, including a blue LED or UV LED, has been developed and commercialized. The use of such an LED has been extended rapidly, and particular examples of the use include general lighting in which the conventional fluorescent lamps or light bulbs are used and light sources in which the conventional short arc lamps are used for curing UV curable resins or UV curable ink.

In general, an LED has an LED die including an anode and cathode formed on the surface thereof. Each of the anode and cathode is wire bonded to the external electrodes and the LED die electrically communicates with the external electrodes to carry out light emission.

In the LED having the above-mentioned constitution, when the LED die and fine wires (such as ϕ 30 μm) are exposed to the external space, the LED die may be damaged or the wires may undergo a short. Thus, the LED is used generally after it is sealed with a sealant (such as a resin).

In addition, when the LED is sealed with a sealant having a refraction index higher than the refraction index of air, the difference in refraction index at the interface between the LED die and sealant is decreased. Therefore, sealing the LED with a sealant is also effective for improving the light ejection efficiency.

In the case of the conventional LED emitting the visible light, a highly transparent epoxy resin, silicone resin, etc. have been used as a sealant (see, Patent Documents 1 and 2). However, when using the conventional epoxy resin or silicone resin is applied to an LED emitting the light with a short wavelength, the resin itself may be degraded due to the short-wavelength light, thereby causing some problems, such as coloration or cracking. In addition, such problems of a sealant become serious particularly in the case of a UV LED used as a light source emitting strong UV rays for curing a UV curable resin or UV curable ink.

For example, the UV LED used as a light source for curing a UV curable resin or UV curable ink includes an LED emitting 1 W of UV light having a wavelength of 365 nm through the supply of an electric power of 3 W to an LED die having a width×length of 1 mm×1 mm. In this case, the light irradiation dose becomes 1 W/mm$^2$, which corresponds to 30,000-50,000 times of the UV light dose included in the solar light. Due to this, it is required for a sealant for an UV LED as a light source for curing a UV curable resin or UV curable ink to have resistance against strong UV rays in addition to high transparency in a wavelength region of light emission for the UV LED.

In addition, since 2 W of the electric power of 3 W inputted to the UV LED is converted into thermal energy so that the LED die itself may be heated, it is required for the sealant for an UV LED as a light source for curing a UV curable resin or UV curable ink to have resistance against heat (temperature) in addition to UV ray resistance.

Further, it has been suggested that a composition including an epoxy group-containing multifunctional polysiloxane and a metal chelate compound is used as a sealant for an LED or the like (Patent Document 3).

REFERENCES

Patent Documents

Japanese Patent Laid-Open No. 2003-176334
Japanese Patent Laid-Open No. 2003-277473
Japanese Patent Laid-Open No. 2010-059359

DISCLOSURE

Technical Problem

The composition disclosed in Patent Document 3 is cured by epoxy ring opening. Since the structure of the cured product includes a metal chelate compound having high absorptivity in the UV region in addition to organic covalent bonds (such as C—C bonds), it shows insufficient transparency in the UV region, UV resistance and heat resistance, when used for sealing a UV LED to which high power is applied.

Under these circumstances, a technical problem to be solved by the present invention is to provide a curable resin composition that has higher transparency in the UV region, UV resistance and heat resistance as compared to the conventional composition for sealing a UV LED and does not cause cracking, peeling or coloration even in the case of sealing of a UV LED to which high power is applied, and an optical semiconductor device using the curable resin composition.

Technical Solution

To solve the above problems, the inventors of the present invention have conducted intensive studies about a raw material for a curable resin composition suitable for sealing a UV LED to which high power is applied in view of transparency, UV resistance, heat resistance and moldability. As a result, the inventors have found that it is possible to obtain an optimized curable resin composition by using an alkoxy oligomer having a non-reactive functional group and a high solid content in order to provide stress-relieving property, in combination with phosphoric acid or at least one alkoxide of metal selected from the group consisting of B, Al, P, Sc, Ga, Y, Zr, Nb, In, Sn, La, Gd, Dy, Yb, Hf, Ta, and W as a curing catalyst for improving reactivity. The present invention is based on this finding.

In one general aspect, there is provided a curable resin composition including an alkoxy oligomer and a curing catalyst, wherein the alkoxy oligomer has an organopolysiloxane structure, and has at least one repeating unit selected from the group consisting of a repeating unit represented by the following Formula 1, repeating unit represented by the following Formula 2, repeating unit represented by the following Formula 3 and a repeating unit represented by the following Formula 4 in combination with at least one repeating unit selected from the group consisting of a repeating unit represented by the following Formula 5, repeating unit represented by the following Formula 6 and a repeating unit represented by the following Formula 7:

[Formula 1]

$$(R^1R^2R^3SiO_{1/2}) \quad (1)$$

(wherein each of $R^1$, $R^2$ and $R^3$ independently represents the same or a different organic group)

[Formula 2]

$$(R^4R^5SiO_{2/2}) \quad (2)$$

(wherein each of $R^4$ and $R^5$ independently represents the same or a different organic group).

[Formula 3]

$$(R^6SiO_{3/2}) \quad (3)$$

(wherein $R^6$ is an organic group)

[Formula 4]

$$(SiO_{4/2}) \quad (4)$$

[Formula 5]

$$(R^7_a(OR^8)_{3-a}SiO_{1/2}) \quad (5)$$

(wherein a is 0, 1 or 2, each of $R^7$ and $R^8$ independently represents the same or a different organic group, and when two or more $R^7$s or $R^8$s are present, each $R^7$ or $R^8$ may be the same or different)

[Formula 6]

$$(R^9_b(OR^{10})_{2-b}SiO_{2/2}) \quad (6)$$

(wherein b is 0 or 1, each of $R^9$ and $R^{10}$ independently represents the same or a different organic group, and when two or more $R^{10}$s are present, each $R^{10}$ may be the same or different)

[Formula 7]

$$((OR^{11})SiO_{3/2}) \quad (7)$$

(wherein $R^{11}$ is an organic group), and wherein the repeating units represented by the Formula 1-Formula 7 are present in an amount of 90-100 mol % based on 100 mol % of the total siloxane units forming the alkoxy oligomer, the atomic ratio of the total amount of O atoms based on the total amount of Si atoms contained in the alkoxy oligomer is 2.3-3.5, and the curing catalyst is phosphoric acid present in an amount of 0.1-17.5 parts by weight based on 100 parts by weight of the alkoxy oligomer or alkoxide of at least one metal selected from the group consisting of B, Al, P, Sc, Ga, Y, Zr, Nb, In, Sn, La, Gd, Dy, Yb, Hf, Ta, and W, present in an amount of 0.5-20 parts by weight based on 100 parts by weight of the alkoxy oligomer.

In addition, the alkoxy oligomer and curing catalyst preferably include no sulfur atom or nitrogen atom.

In addition, $R^1$, $R^2$, $R^3$, $R^4$, $R^5$, $R^6$, $R^7$, $R^8$, $R^9$, $R^{10}$ and $R^{11}$ preferably represent methyl groups.

In addition, the curing catalyst preferably includes no Ti Compound or chelate compound.

In addition, the alkoxy groups are present in the alkoxy oligomer preferably in an amount of 10-30 mass %.

In addition, the alkoxy oligomer is present preferably in a liquid state at room temperature.

In addition, when UV rays having a predetermined wavelength are irradiated to the solidified product obtained by curing the curable resin composition at a luminous intensity of about 100 W/cm² for 500 hours, the solidified product preferably shows a UV transmission of at least 85%. In addition, in this case, when UV rays are irradiated for 1000 hours to the solidified product, the solidified product preferably shows a UV transmission of at least 85%. Further, when UV rays are irradiated for 5000 hours to the solidified product, the solidified product preferably shows a UV transmission of at least 80%. Preferably, the predetermined wavelength is about 365 nm.

In another aspect, there is provided an optical semiconductor system including an optical semiconductor device sealed with the above-mentioned curable resin composition. In this case, the optical semiconductor device preferably emits the light within the ultraviolet region.

Advantageous Effects

According to the embodiments of the present invention, there is provided a curable resin composition that shows significantly higher transparency in the ultraviolet region, UV resistance and heat resistance as compared to the conventional compositions used for sealing a UV LED, and causes no cracking, peeling or coloration even when applied for sealing a UV LED to which high power is applied. Also, there is provided an optical semiconductor device including the curable resin composition.

DESCRIPTION OF DRAWINGS

FIG. 1 is a schematic view illustrating a surface mount type UV LED using the curable resin composition according to an embodiment.

FIG. 2 is a schematic view illustrating a package type UV LED using the curable resin composition according to an embodiment.

FIG. 3 is a graph illustrating the results of transmission of the curable resin composition according to Example 3.

FIG. 4 is a graph illustrating the results of transmission of the curable resin composition according to Example 7.

FIG. 5 is a graph illustrating the results of transmission of the curable resin composition according to Example 9.

FIG. 6 is a graph illustrating the results of transmission of the curable resin composition according to Example 10.

FIG. 7 is a graph illustrating the results of luminous intensity of the curable resin composition according to Example 1.

FIG. 8 is a graph illustrating the results of luminous intensity of the curable resin composition according to Example 3.

FIG. 9 is a graph illustrating the results of luminous intensity of the curable resin composition according to Example 7.

FIG. 10 shows the transmission characteristics of the curable resin composition according to Comparative Example 1.

FIG. 11 shows the transmission characteristics of the curable resin composition according to Comparative Example 2.

FIG. 12 shows the transmission characteristics of the curable resin composition according to Comparative Example 3.

DESCRIPTION OF MAIN ELEMENTS 100, 200: UV LED    101: substrate
102a, 202a: cathode pattern    102b, 202b: anode pattern
103, 203: LED die    103a, 203a: exit surface
104, 204a, 204b: bonding wire    105: frame material
106: solidified product    210: casing
210a: bottom portion

BEST MODE

Exemplary embodiments now will be described more fully hereinafter with reference to the accompanying drawings, in which exemplary embodiments are shown. This disclosure may, however, be embodied in many different forms and should not be construed as limited to the exemplary embodiments set forth therein.

For example, the curable resin composition according to an embodiment is used for sealing a UV LED to which high power is applied, and is obtained by combining an alkoxy oligomer with a curing catalyst.

[Alkoxy Oligomer]

The alkoxy oligomer according to an embodiment has an organopolysiloxane structure, and has at least one repeating unit selected from the group consisting of a repeating unit represented by the following Formula 1, repeating unit represented by the following Formula 2, repeating unit represented by the following Formula 3 and a repeating unit represented by the following Formula 4 in combination with at least one repeating unit selected from the group consisting of a repeating unit represented by the following Formula 5, repeating unit represented by the following Formula 6 and a repeating unit represented by the following Formula 7:

[Formula 1]

$(R^1R^2R^3SiO_{1/2})$  (1)

(wherein each of $R^1$, $R^2$ and $R^3$ independently represents the same or a different organic group)

[Formula 2]

$(R^4R^5SiO_{2/2})$  (2)

(wherein each of $R^4$ and $R^5$ independently represents the same or a different organic group).

[Formula 3]

$(R^6SiO_{3/2})$  (3)

(wherein $R^6$ is an organic group)

[Formula 4]

$(SiO_{4/2})$  (4)

[Formula 5]

$(R^7_a(OR^8)_{3-a}SiO_{1/2})$  (5)

(wherein a is 0, 1 or 2, each of $R^7$ and $R^8$ independently represents the same or a different organic group, and when two or more $R^7$s or $R^8$s are present, each $R^7$ or $R^8$ may be the same or different)

[Formula 6]

$(R^9_b(OR^{10})_{2-b}SiO_{2/2})$  (6)

(wherein b is 0 or 1, each of $R^9$ and $R^{10}$ independently represents the same or a different organic group, and when two or more $R^{10}$s are present, each $R^{10}$ may be the same or different)

[Formula 7]

$((OR^{11})SiO_{3/2})$  (7)

(wherein $R^{11}$ is an organic group).

The repeating unit represented by Formula 1, i.e. the repeating unit represented by the formula of $(R^1R^2R^3SiO_{1/2})$ is a mono-functional repeating unit (M unit), the repeating unit represented by Formula 2, i.e. the repeating unit represented by the formula of $(R^4R^5SiO_{2/2})$ is a di-functional repeating unit (D unit), the repeating unit represented by Formula 3, i.e., the repeating unit represented by the formula of $(R^6SiO_{3/2})$ is a tri-functional repeating unit (T unit), and the repeating unit represented by Formula 4, i.e., the repeating unit represented by the formula of $(SiO_{4/2})$ is a quadra-functional repeating unit (Q unit).

In addition, the repeating unit represented by Formula 5, i.e., the repeating unit represented by the formula of $(R^7_a(OR^8)_{3-a}SiO_{1/2})$ is a repeating unit in which a is 0, 1 or 2. The repeating unit represented by Formula 5 is a di-functional repeating unit represented by the formula of $(R^7_2(OR^8)SiO_{1/2})$ having one alkoxy group, $OR^8$, when a is 2; is a tri-functional repeating unit represented by the formula of $(R^7(OR^8)_2SiO_{1/2})$ having two alkoxy groups, $OR^8$, when a is 1; and is a quadra-functional repeating unit represented by the formula of $((OR^8)_3SiO_{1/2})$ having three alkoxy groups, $OR^8$, when a is 0.

The repeating unit represented by Formula 6, i.e., the repeating unit represented by the formula of $(R^9_b(OR^{10})_{2-b}SiO_{2/2})$ is a repeating unit in which b is 0 or 1. The repeating unit represented by Formula 6 is a tri-functional repeating unit represented by the formula of $(R^9(OR^{10})SiO_{2/2})$ having one alkoxy group, $OR^{10}$, when b is 1; and is a quadra-functional repeating unit represented by the formula of $((OR^{10})_2SiO_{2/2})$ having two alkoxy groups, $OR^{10}$, when b is 0.

The repeating unit represented by Formula 7, i.e., the repeating unit represented by the formula of $((OR^{11})SiO_{3/2})$ is a quadra-functional repeating unit having two alkoxy groups, $OR^{11}$.

In the compound represented by Formula 1, each of $R^1$, $R^2$ and $R^3$ independently represents the same or a different organic group. In the compound represented by Formula 2, each of $R^4$ and $R^5$ independently represents the same or a different organic group. In the compound represented by Formula 3, $R^6$ is an organic group.

Additionally, in Formula 5, each of $R^7$ and $R^8$ independently represents the same or a different organic group. When two or more $R^7$s and two or more $R^8$s are present, each $R^7$ and each $R^8$ may be the same or different.

In the compound represented by Formula 6, each of $R^9$ and $R^{10}$ independently represents the same or a different organic group. When two or more $R^{10}$s are present, each $R^{10}$ may be the same or different.

In the compound represented by Formula 7, $R^{11}$ is an organic group.

Thus, each of the organic groups represented by $R^1$-$R^{11}$ independently represents the same or a different organic group.

Preferably, the organic group represented by $R^1$-$R^{11}$ is a hydrocarbon group, more preferably a C1-C12 hydrocarbon group, even more preferably a C1-C8 hydrocarbon group, still even more preferably a C1-C4 hydrocarbon group, still even much more preferably a C1-C3 hydrocarbon group, and particularly a C1-C2 hydrocarbon group.

Particular examples of the hydrocarbon group may include at least one selected from alkyl groups.

When the hydrocarbon group is an alkyl group, particular examples of the alkyl group include methyl, ethyl, propyl, butyl, pentyl, hexyl, heptyl, octyl, nonyl, decyl, undecyl, dodecyl, or the like, methyl or ethyl is preferred, and methyl is more preferred.

In the curable resin composition disclosed herein, the alkoxy oligomer is preferably an alkoxy oligomer in which at least one of the organic groups contained in the repeating units forming the alkoxy oligomer is a C1-C4 alkyl group, and the organic groups other than the alkyl group is a C1-C8 hydrocarbon group.

In addition, in the curable resin composition disclosed herein, the alkoxy oligomer is preferably an alkoxy oligomer in which at least one of the organic groups contained in the repeating units forming the alkoxy oligomer is a methyl group, and all organic groups contained in the repeating units forming the alkoxy oligomer are methyl groups.

In general, Si—O bonds as a backbone of silicone has about 50% of ionic binding, which is larger as compared to the C—C bonds in a general organic resin, such as polyethylene. Due to this, the chemical stability of C—H bonds or C—C bonds at the side chain of silicone is increased as compared to the backbone of C—C bonds. Generally, silicone has a structure not susceptible to oxidation of UV rays.

However, when side chains, such as C—H bonds or C—C bonds, are increased and the distance between the atom forming the side chain and Si atom is increased, there is a problem in that contribution to stabilization derived from the ionic binding of Si—O bonds is degraded. Due to this, it is preferred that the organic groups at the side chains (i.e., organic groups represented by $R^1$-$R^{11}$) have a smaller number of carbon atoms. Particularly, a methyl group is the smallest alkyl group, has a small distance between each atom forming a methyl group and Si atom (bound to methyl) to contribute to stabilization through ionic binding, and includes no C—C bond. Thus, methyl is most preferred.

In addition, the organic groups represented by $R^1$-$R^{11}$ preferably include no aromatic ring.

For example, when an aromatic ring-containing group, such as a phenyl group, is used as an organic group represented by $R^1$-$R^{11}$, the functional group has a double bond, and thus $\pi$-$\pi$* transition derived from the $\pi$ electrons of the double bond causes absorption over a range from the UV region to the visible region, resulting in degradation of transmission in the UV region and UV resistance. Therefore, it is preferred that the organic groups represented by $R^1$-$R^{11}$ are those containing no aromatic rings, such as benzene-based aromatic rings, hetero-aromatic rings or non-benzene-based aromatic rings.

In addition, it is preferred that the organic groups represented by $R^1$-$R^{11}$ include no N atom-containing groups (such as an amino group) or S atom-containing groups (such as a mercapto group) in order to inhibit degradation of UV resistance. In addition, for the same reason, when the organic groups represented by $R^1$-$R^{11}$ are hydrocarbon groups other than aromatic hydrocarbon groups, it is preferred that they include no C—C bond (C—C bond, C=C bond or C≡C bond)-containing group.

As described above, in the curable resin composition disclosed herein, the alkoxy oligomer includes at least one repeating unit selected from the group consisting of a repeating unit represented by the following Formula 5 ($R^7_a(OR^8)_{3-a}SiO_{1/2}$), repeating unit represented by the following Formula 6 ($R^9_b(OR^{10})_{2-b}SiO_{2/2}$) and a repeating unit represented by the following Formula 7 (($OR^{11}$)$SiO_{3/2}$).

In the curable resin composition disclosed herein, the alkoxy oligomer includes alkoxy group-containing repeating units selected from the group consisting of the repeating units represented by Formula 5-Formula 7. Thus, it is thought that when the curable resin composition is used as a sealant for an optical semiconductor device forming an optical semiconductor system, the alkoxy groups are firmly bound chemically to a die surface, substrate surface, circuit pattern surface, etc. to be sealed.

In other words, since a protective layer including $SiO_2$ or the like is formed on the surface of a die including inorganic materials and such a surface generally has hydroxyl groups, the alkoxy groups in the repeating units selected from the group consisting of the repeating units represented by Formula 5-Formula 7 are bound to the hydroxyl groups of a die surface through hydrogen bonding or intermolecular force, such as Van der Waals force. In addition, it is though that some bonds are formed between the alkoxy groups and the hydroxyl groups of a die surface through dealcoholization-condensation and dehydration, and thus the both groups are chemically and firmly bound to each other.

Thus, when using the curable resin composition disclosed herein as a sealant, the cured product (solidified product) obtained by curing the curable resin composition is bound firmly to a die, or the like. By virtue of this, even when using the curable resin composition is used for sealing a UV LED to which high power is applied, it is though that the cured product (solidified product) of the curable resin composition can be inhibited effectively from cracking or peeling.

In the curable resin composition disclosed herein, the alkoxy oligomer includes the repeating units represented by Formula 1-Formula 7 in an amount of 90-100 mol %, preferably in an amount of 95-100 mol %, and even more preferably in an amount of 100 mol %, based on 100 mol % of the total siloxane units forming the alkoxy oligomer.

In other words, in the curable resin composition disclosed herein, the alkoxy oligomer, the sum of the mol % of the repeating units represented by Formula 1, mol % of the repeating units represented by Formula 2, mol % of the repeating units represented by Formula 3, mol % of the repeating units represented by Formula 4, mol % of the repeating units represented by Formula 5, mol % of the repeating units represented by Formula 5, mol % of the repeating units represented by Formula 6 and the mol % of the repeating units represented by Formula 7 is 90-100 mol %, preferably 95-100 mol %, and more preferably 100 mol % (the siloxane units forming the siloxane resin totally include any one of the repeating units represented by Formula 1-Formula 7), based on 100 mol % of the total siloxane units forming the alkoxy oligomer.

In the repeating units forming the alkoxy oligomer, the proportion of each of the repeating units represented by Formula 1-Formula 7 is not particularly limited. However, when a predetermined amount of non-reactive functional groups are not present, curing of the curable resin composition provides an excessively hard cured product (solidified product) and the stress generated upon heating and cooling may not be relieved. In this case, the bonding wires in a UV LED may be cut or an LED die itself may be destroyed.

Therefore, in the curable resin composition disclosed herein, the alkoxy oligomer preferably has an atomic ratio of total O atoms to total Si atoms contained in the alkoxy oligomer (total O atoms contained in the alkoxy oligomer/total Si atoms contained in the alkoxy oligomer) of 2.3-3.5, more preferably 2.3-3.4, and even more preferably 2.2-3.2.

When the atomic ratio of total O atoms to total Si atoms contained in the alkoxy oligomer is within the above-defined range, it is possible for the alkoxy oligomer to include a predetermined amount of non-reactive functional groups, and thus it is possible to relieve the stress generated upon heating and cooling adequately.

When the atomic ratio of total O atoms to total Si atoms contained in the alkoxy oligomer is less than 2.3, UV resistance may be degraded. When the atomic ratio is larger than 3.5, the cured product (solidified product) of the curable resin may be cracked or broken with ease.

The atomic ratio of total O atoms to total Si atoms contained in the alkoxy oligomer may be controlled by adjusting the proportion of each of the repeating units represented by Formula 1-Formula 7 forming the alkoxy oligomer.

In the curable resin composition disclosed herein, the alkoxy oligomer preferably has a predetermined range of ratios of the mole number of di-functional repeating units to the sum of the mole number of di-functional repeating units and the mole number of tri-functional repeating units.

In other words, in the curable resin composition disclosed herein, the alkoxy oligomer preferably has a ratio of Tn/(Dn+Tn) of 0.2-1, more preferably 0.25-1, and even more preferably 0.3-1, when the sum of the mole number of the repeating units $(R^7_2(OR^8)SiO_{1/2}$, i.e., repeating units represented by Formula 5 $(R^7_a(OR^8)_{3-a}SiO_{1/2})$, wherein a is 2) and the mole number of the repeating units represented by Formula 2, referred to as D units $(R^4R^5SiO_{2/2})$, is taken as Dn, and the sum of the mole number of the repeating units $(R^7(OR^8)_2SiO_{1/2}$, i.e., repeating units represented by Formula 5 $(R^7_a(OR^8)_{3-a}SiO_{1/2})$, wherein a is 1), the mole number of repeating units $(R^9(OR^{10})SiO_{2/2}$, i.e., repeating units represented by Formula 6 $(R^9_b(OR^{10})_{2-b}SiO_{2/2})$, wherein b is 1) and the mole number of the repeating units represented by Formula 3, referred to as T units $(R^6SiO_{3/2})$, is taken as Tn.

The repeating units $(R^7_2(OR^8)SiO_{1/2}$, i.e., repeating units represented by Formula 5 $(R^7_a(OR^8)_{3-a}SiO_{1/2})$, wherein a is 2) are generally incorporated to the alkoxy oligomer during the preparation thereof, while the alkoxy groups in the starting material for the repeating units represented by Formula 2 $(R^4R^5SiO_{2/2})$ partially remain in an unreacted state.

In addition, the repeating units $(R^7(OR^8)_2SiO_{1/2}$, i.e., repeating units represented by Formula 5 $(R^7_a(OR^8)_{3-a}SiO_{1/2})$, wherein a is 1) or the repeating units $(R^9(OR^{10})SiO_{2/2}$, i.e., repeating units represented by Formula 6 $(R^9_b(OR^{10})_{2-b}SiO_{2/2})$, wherein b is 1) are generally incorporated to the alkoxy oligomer during the preparation thereof, while the alkoxy groups in the starting material for the repeating units represented by Formula 3 $(R^6SiO_{3/2})$ partially remain in an unreacted state.

As described above, when using the curable resin composition disclosed herein as a sealant for an optical semiconductor device forming an optical semiconductor system, the alkoxy group of the repeating units represented by Formula 5-Formula 7 in the alkoxy oligomer are chemically and firmly bound to a die surface to be sealed. Considering a balance between alkoxy groups and organic groups in the alkoxy oligomer, it is preferred that the alkoxy oligomer totally includes di-functional repeating units and tri-functional repeating units. However, considering a binding between the sealant and a die, it is advisable that Tn is larger than Dn.

When the ratio represented by Tn/(Dn+Tn) is within the above-defined ratio, use of the curable resin composition as a sealant for an optical semiconductor device allows sufficient binding to a die surface. Even when using the curable resin for sealing a UV LED to which high power is applied and high-intensity UV light is irradiated thereto, it is possible to inhibit the interface between a die surface and the cured product (solidified product) of the curable resin composition from cracking or peeling.

In the curable resin composition disclosed herein, the alkoxy groups are present in an amount of 10-30 wt %, preferably 11-27.5 wt %, and more preferably 12-25 wt % in the alkoxy oligomer.

When the alkoxy groups are present in the alkoxy oligomer within the above-defined range, it is possible to retain a desired solid content, to inhibit three-dimensional binding, and to provide desired stress-relieving property.

In the curable resin composition disclosed herein, the weight average molecular weight of the alkoxy oligomer is not particularly limited and is selected suitably depending on its use. When the curable resin composition is used as a sealant for an optical semiconductor device, such as UV LED, any curable resin composition may be selected accordingly.

The alkoxy oligomer preferably has a weight average molecular weight of 500-4,500, more preferably 750-4,250, and even more preferably 1,000-4,000. In addition, the alkoxy oligomer includes hydroxyl (OH) groups in an amount of 15 wt % or less, preferably 10 wt % or less, and more preferably 5 wt % or less.

In the curable resin composition disclosed herein, there is no particular limitation in methods for preparing the alkoxy oligomer.

In the curable resin composition disclosed herein, the alkoxy oligomer may be obtained by combining a predetermined amount of each of organoxysiloxanes represented by the following Formula 1'-Formula 4' corresponding to each of the siloxane units represented by Formula 1-Formula 4, followed by hydrolysis and condensation:

[Formula 1']

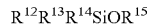

$$R^{12}R^{13}R^{14}SiOR^{15} \qquad (1)'$$

(wherein each of $R^{12}$, $R^{13}$, $R^{14}$ and $R^{15}$ independently represents the same or a different an organic group)

[Formula 2']

$$R^{16}R^{17}Si(OR^{18})(OR^{19}) \qquad (2)'$$

(wherein each of $R^{16}$, $R^{17}$, $R^{18}$ and $R^{19}$ independently represents the same or a different organic group)

[Formula 3']

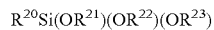

$$R^{20}Si(OR^{21})(OR^{22})(OR^{23}) \qquad (3)'$$

(wherein each of $R^{20}$, $R^{21}$, $R^{22}$ and $R^{23}$ independently represents the same or a different organic group)

[Formula 4']

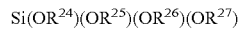

$$Si(OR^{24})(OR^{25})(OR^{26})(OR^{27}) \qquad (4)'$$

(wherein each of $R^{24}$, $R^{25}$, $R^{26}$ and $R^{27}$ independently represents the same or a different organic group).

Particular examples of the organic groups represented by $R^{12}$-$R^{27}$ may include those of the organic groups represented by $R^1$-$R^{11}$ as mentioned above.

In the hydrolysis and condensation, hydrolysis does not go to completion but a predetermined amount of alkoxy groups are allowed to remain in the hydrolyzed product. Since a part of the alkoxy groups (—$OR^{18}$, —$OR^{19}$, —$OR^{21}$, —$OR^{22}$, —$OR^{23}$, —$OR^{24}$, —$OR^{25}$, —$OR^{26}$, —$OR^{27}$) forming the organoxysiloxanes represented by Formula 2'-Formula 4' still remain, it is possible to form at least one siloxane units selected from the siloxane units represented by Formula 5-Formula 7 in the resultant alkoxy oligomer.

The residual amount of the alkoxy groups may be controlled by adjusting the conditions of hydrolysis and condensation (catalyst used therein, reaction time, reaction temperature, or the like).

The mixing ratio of the organoxysiloxanes represented by Formula 1'-Formula 4' may be selected suitably according to the alkoxy oligomer to be produced.

In the curable resin composition disclosed herein, according to a particular embodiment, the method for preparing an alkoxy oligomer includes hydrolyzing methyltrimethoxysilane (rational formula: $CH_3Si(OCH_3)_3$, abbreviated as MTMS hereinafter) or a mixture of MTMS with dimethyldimethoxysilane (rational formula: $(CH_3)_2Si(OCH_3)_2$, abbreviated as DMDMS hereinafter) in the presence of a catalyst and water.

In addition, the alkoxy oligomer in the curable resin composition may be a silicone alkoxy oligomer obtained by the methods other than the above-mentioned method.

Particular examples of the alkoxy oligomer may include silicone alkoxy oligomers available from Shinetsu Chemical Industry Co. Ltd., such as X-40-9225, X-40-9246, X-40-9250, KC-89S or KR-500, or XC-96-B0446, XR31-B1410 or XR31-B2230 available from Momentive Performance Materials Japan LLC.

In the curable resin composition disclosed herein, when the alkoxy oligomer is obtained by hydrolyzing and condensing the organoxysiloxanes represented by Formula 1'-Formula 4', the reaction may be carried out generally at a temperature of about 0-100° C. for several tens of minutes to one day.

Particular examples of the catalyst for use in hydrolysis and condensation of the organoxysiloxanes represented by Formula 1'-Formula 4' may include inorganic acids, such as hydrochloric acid, nitric acid, sulfuric acid, perchloric acid or phosphoric acid, and organic acids, such as formic acid and acetic acid. In addition, an organic acid may be added to carry out hydrolysis and condensation at the same time, as desired. In this case, particular examples of the solvent may include alcohols, such as methanol, ethanol, 1-propanol and 2-propanol, aromatic compounds, such as toluene and xylene, ketones such as acetone, and esters such as ethyl acetate.

In the organoxysiloxanes represented by Formula 1'-Formula 4', it is preferred that the organic groups represented by $R^{12}$-$R^{27}$ include no aromatic ring.

As described above, when an aromatic ring-containing group, such as a phenyl group, is used as an organic group represented by $R^{12}$-$R^{27}$, the functional group has a double bond, and thus π-π* transition derived from the π electrons of double bond causes absorption over a range from the UV region to the visible region, resulting in degradation of transmission in the UV region and UV resistance with ease. Therefore, it is preferred that the organic groups represented by $R^{12}$-$R^{27}$ are those containing no aromatic rings, such as benzene-based aromatic rings, hetero-aromatic rings or non-benzene-based aromatic rings.

In addition, it is preferred that the organic groups represented by $R^{12}$-$R^{27}$ include no N atom-containing groups (such as an amino group) or S atom-containing groups (such as a mercapto group) in order to inhibit degradation of UV resistance. In addition, for the same reason, when the organic groups represented by $R^9$-$R^{24}$ are hydrocarbon groups other than aromatic hydrocarbon groups, it is preferred that they include no C—C bond (C—C bond, C=C bond or C≡C bond)-containing group.

In the curable resin composition disclosed herein, it is preferred that the alkoxy oligomer is a silicone-based material having an organosiloxane structure present in a liquid state at room temperature (25° C.).

In the curable resin composition, when the alkoxy oligomer is present in a liquid state at room temperature (25° C.), it is possible to carry out packing and molding with ease.

In addition, in the present disclosure, the expression 'present in a liquid state at room temperature' means that the alkoxy oligomer has a viscosity of $10^3$ Pa·s or less at room temperature as determined according to the specification of JIS Z 8803.

The curable resin composition disclosed herein preferably includes the alkoxy oligomer in an amount of 50.0-99.9 mass %, more preferably 70.0-99.5 mass %, and even more preferably 90.0-99.0 mass %, as expressed by solid content (non-volatile content).

In the curable resin composition disclosed herein, when the amount of the alkoxy oligomer is within the above-defined range, the curable resin composition has significantly higher transparency in the UV region, UV resistance and heat resistance as compared to the conventional curable resin compositions. In addition, when using the curable resin composition disclosed herein for sealing a UV LED to which high power is applied, it is possible to inhibit cracking, peeling and coloration with ease.

[Curing Catalyst]

According to an embodiment, the curing catalyst is one capable of curing the above-described alkoxy oligomer. Particularly, the curing catalyst is phosphoric acid ($H_3PO_4$) or alkoxide of at least one metal selected from the group consisting of B, Al, P, Sc, Ga, Y, Zr, Nb, In, Sn, La, Gd, Dy, Yb, Hf, Ta and W.

The curing catalyst may be a solution containing phosphoric acid ($H_3PO_4$) in combination with alkoxysilane, particularly a mixture of aqueous ortho-phosphoric acid (rational formula: $H_3PO_4$) solution with dimethyl dimethoxy silane (DMDMS). In addition, aqueous ortho-phosphoric acid solution contains $H_2O$, which is consumed completely through the reaction with methoxy groups ($CH_3O$—) in DMDMS, as represented by the following Reaction Scheme 8:

[Reaction Scheme 8]

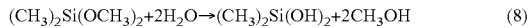

$$(CH_3)_2Si(OCH_3)_2 + 2H_2O \rightarrow (CH_3)_2Si(OH)_2 + 2CH_3OH \quad (8)$$

In addition, although the above-mentioned preparation of a curing catalyst uses DMDMS as alkoxysilane to be combined with ortho-phosphoric acid, the alkoxysilane represented by Chemical Formula 9 may also be used:

[Chemical Formula 9]

$$R^1{}_n Si(OR^2)_{4-n} \quad (9)$$

In Chemical Formula 9, $R^1$ and $R^2$ are the organic groups represented by the formula of $C_kH_{2k+1}$— (wherein k=1, 2) and $C_mH_{2m-1}$— (wherein m=1, 2, 3, 4, 5), respectively, and n is an integer of 0-3.

In addition, when the added amount of phosphoric acid ($H_3PO_4$) is excessively small, curing cannot be accomplished or proceeds too slowly. When the added amount of phosphoric acid ($H_3PO_4$) is excessively large, the resultant solidified product becomes excessively hard and causes a problem in that it undergoes significant degradation of ability of relieving the stress generated according to a change in temperature resulting from lighting/light-out of an LED. Thus, phosphoric acid is added in an amount of 0.1-17.5 parts by weight, preferably 0.2-15.0 parts by weight, and more preferably 0.3-12.5 parts by weight, based on 100 parts by weight of the alkoxy oligomer.

Further, as described above, it is possible to use at least one alkoxide of metal selected from the group consisting of B, Al, P, Sc, Ga, Y, Zr, Nb, In, Sn, La, Gd, Dy, Yb, Hf, Ta and W instead of phosphoric acid ($H_3PO_4$). In this case, the added amount of metal alkoxide is 0.5-20 parts by weight based on 100 parts by weight of the alkoxy oligomer. When the amount of metal alkoxide is less than 0.5 parts by weight, curing cannot be accomplished or proceeds too slowly. When the amount of metal alkoxide is larger than 20 parts by weight, the resultant solidified product becomes excessively hard.

In addition, similarly to the alkoxy oligomer, a material containing nitrogen (N) or S (sulfur) that causes degradation of UV resistance, a material having a carbon-carbon bond (C—C bond, C═C bond or C≡C bond)-containing group, and a material containing Ti are not used in the curing catalyst. Further, a highly acidic or highly alkaline catalyst or a material containing an alkali metal, such as Li, Na or K, which damages an LED die in a UV LED, is not used. In addition, harmful materials, such as Pb, Hg, As or Cd, are not used.

Meanwhile, a metal chelate compound formed by coordination of a chelating agent (such as acetyl acetone (rational formula: $C_5H_8O_2$), ethyl acetoacetate (rational formula: $C_6H_9O_3$)) to a metal ion is used frequently as a curing catalyst by virtue of its stability. However, π-π* transition in the chelate ring causes absorption over a range from the UV region and the visible region. Such absorption does not always coincide with the light emission peak wavelength of a UV LED. However, since a UV LED generally emits the UV light having a large light emission spectrum width, absorption of the UV light occurs in the range that coincides with the absorption spectrum of the metal chelate compound. Thus, when using a metal chelate compound as a curing catalyst, there are disadvantages in that absorption characteristics in the UV region and UV resistance are degraded. As a result, a metal chelate compound is not used as a curing catalyst.

[Preparation of Curable Resin Composition]

The curable resin composition according to an embodiment is obtained by adding the curing catalyst as described above to the alkoxy oligomer as described above, followed by mixing for a predetermined time. There is no particular limitation in a method for preparing a curable resin composition, as long as it allows uniform mixing of the alkoxy oligomer with the curing catalyst.

The curable resin composition according to an embodiment is present in a liquid state at room temperature. Thus, when using the curable resin composition as a sealant for a UV LED, a predetermined amount of the curable resin composition is cast into a UV LED package, followed by heating and drying for a predetermined time. In addition, the heating condition is not particularly limited, as long as it allows the curable resin composition to be cured into a desired state. For example, it is preferred to carry out heating at 100-200° C. for about 1-2 hours.

[Constitution of LED Sealed with Curable Resin Composition]

As described above, the curable resin composition according to an embodiment is suitable for a sealant for a UV LED to which high power is applied, for example. FIG. 1 is a schematic view (sectional view) illustrating a surface mount type UV LED 100 using the curable resin composition according to an embodiment. In addition, FIG. 2 is a schematic view (sectional view) illustrating a package type UV LED 200 using the curable resin composition according to an embodiment.

As shown in FIG. 1, the UV LED 100 includes a substrate 101, LED die 103, or the like. The substrate 101 is a so-called circuit board including an insulating material (such as ceramic (aluminum nitride, alumina, silicon nitride, silicon carbide, etc.)). As shown in FIG. 1, the surface of the substrate 101 has a cathode pattern 102a and an anode pattern 102b including a conductive metallic material (such as copper, aluminum, etc.).

The LED die 103 has a square column-like shape, the top surface (exit surface 103a) thereof is provided with a cathode terminal (not shown) and the bottom surface thereof is provided with an anode terminal (not shown). The bottom surface (anode terminal) of the LED die 103 is connected mechanically and electrically with the cathode pattern 102a through a die bonding agent (not shown). In addition, the cathode terminal provided in the top surface of the LED die 103 is joined electrically with the anode pattern 102b through a bonding wire 104. In addition, when electric current is applied between the anode terminal and the cathode terminal through the cathode pattern 102a and the anode pattern 102b, UV light (for example, UV light having a wavelength of 365 nm) is generated from the light-emitting layer (not shown) in the LED die 103 and exits from the exit surface 103a.

A frame material 105 is installed around the LED die 103, and the LED die 103 inside the frame material 105 is sealed with a solidified product 106 of the curable resin composition according to an embodiment.

For example, a method for fabricating the UV LED 100 as shown in FIG. 1 includes carrying out die bonding of the LED die 103 to the cathode pattern 102a, carrying out wire bonding of the cathode terminal of the LED die 103 with the anode pattern 102b by way of the bonding wire 104, filling the inside of the frame material 105 with the curable resin composition disclosed herein, and then heating and curing the curable resin composition at 100-200° C. for 1-2 hours.

The UV LED 200 as shown in FIG. 2 is different from the UV LED 100 as shown in FIG. 1 in that the UV LED 200 has a cathode terminal (not shown) and an anode terminal (not shown) formed on the top surface (exit surface 203a) of the LED die 203, the LED die 203 is received in a casing 210, and another solidified product 207 is provided on the solidified product 206 of the curable resin composition disclosed herein.

As shown in FIG. 2, the UV LED 200 includes a casing 210, an LED die 203, or the like. The casing 210 is a bowl-like member formed of an insulating material (such as ceramic). As shown in FIG. 2, a cathode pattern 202a and an anode pattern 202b are formed on the bottom portion 210a of the casing 210 in such a manner that they may be drawn from the inner part of the casing 210 toward the outer part thereof.

The LED die 203 has a square column-like shape and the top surface (i.e., exit surface 203a) thereof has a cathode terminal (not shown) and an anode terminal (not shown). The bottom surface of the LED die 203 is fixed to the bottom portion 210a of the casing 210 through a die bonding agent (not shown). In addition, the anode terminal on the top surface 203 of the LED die is joined electrically with the cathode pattern 202a through a bonding wire 204a, and the cathode terminal on the top surface of the LED die 203 is joined electrically with the anode pattern 202b through a bonding wire 204b. In addition, when electric current is applied between the anode terminal and the cathode terminal through the cathode pattern 202a and the anode pattern 202b, UV light (for example, UV light having a wavelength of 365 nm) is generated from the light-emitting layer (not shown) in the LED die 203 and exits from the exit surface 203a.

The LED die 203 is surrounded with the wall surfaces of the casing 210, and the LED die inside the casing 210 is sealed with a solidified product 206 of the curable resin composition disclosed herein. In addition, a solidified product 207 of another curable resin composition different from the curable resin composition disclosed herein in terms of refractive index or elastic modulus is formed on the solidified product 206.

For example, a method for fabricating the UV LED 200 as shown in FIG. 2 includes carrying out die bonding of the LED die 203 to the inner part of the casing 210, carrying out wire bonding of the anode terminal and the cathode terminal of the LED die 203 with the cathode pattern 202a and the anode pattern 202b, respectively, by way of the bonding wire 204a, 204b, filling the inside of the casing 210 with the curable resin composition disclosed herein, heating and curing the curable resin composition at 100-200° C. for 1-2 hours, filling another curable resin composition for the solidified product 207, and then curing the curable resin composition for the solidified product 207 by heating it at a predetermined temperature for a predetermined time.

EXAMPLES

Hereinafter, the present invention will be explained in detail with reference to examples and comparative examples. However, the following examples and experiments are for illustrative purposes only and not intended to limit the scope of this disclosure. In addition, the following is applied to Example 2-Example 10 and Comparative Example 1-Comparative Example 5.

(1) 'Di-functional repeating units' may include repeating units represented by $R^7_2(OR^8)SiO_{1/2}$, i.e., repeating units represented by Formula 5 ($R^7_a(OR^8)_{3-a}SiO_{1/2}$), wherein a is 2.

(2) 'Tri-functional repeating units' may include repeating units represented by $R^7(OR^8)_2SiO_{1/2}$, i.e., repeating units represented by Formula 5 ($R^7_a(OR^8)_{3-a}SiO_{1/2}$), wherein a is 1, and repeating units represented by $R^9(OR^{10})SiO_{2/2}$, i.e., repeating units represented by Formula 6 ($R^9_b(OR^{10})_{2-b}SiO_{2/2}$), wherein b is 1.

(3) 'Quadra-functional repeating units' may include repeating units represented by $(OR^8)_3SiO_{1/2}$, i.e., repeating units represented by Formula 5 ($R^7_a(OR^8)_{3-a}SiO_{1/2}$), wherein a is 0, and represents units represented by Formula 7 ($(OR^{11})_2SiO_{2/3}$).

Example 1

(Preparation of Alkoxy Oligomer)

To a 500 mL four-necked flask equipped with a nitrogen inlet tube, Liebig condenser and a dropping funnel having a stopcock attached thereto, 68.10 g (0.50 mol) of methyl trimethoxysilane (MTMS) Z-6366 (rational formula $CH_3Si(OCH_3)_3$, molecular weight: 136.2) available from Toray-Dow Corning Co., Ltd., and 32.04 g (1.00 mol) of methanol are added, followed by mixing under agitation at room temperature. Next, hydrochloric acid (rational formula: HCl) is used as a hydrolysis catalyst in order to hydrolyze the methoxy groups of MTMS, and 13.52 g of aqueous hydrochloric acid solution is added dropwise to the above reaction mixture under agitation in an amount of 3.70 mol/L in such a manner that the molar ratio of HCl/MTMS is 0.1 and that of $H_2O$/MTMS is 1.5, and then agitation is further carried out for 30 minutes. Then, the four-necked flask is mounted to a mantle heater and reflux is carried out at 80° C. for 4 hours. After that, the reaction mixture is cooled to room temperature and allowed to stand for 1 hour, thereby providing a transparent and homogeneous viscous liquid (alkoxy oligomer, alkoxy group content: 19 wt %).

(Preparation of Curing Catalyst)

While 100.00 g of Z-6329 available from Toray-Dow Corning Co., Ltd. (chemical name: dimethyl dimethoxysilane (DMDMS), rational formula $(CH_3)_2Si(OCH_3)_2$, molecular weight: 120.2) cooled in an ice bath is agitated, 25.93 g of aqueous ortho-phosphoric acid solution (ration formula: $H_3PO_4$) ($H_3PO_4$ concentration: 85%) is added dropwise thereto over 15 minutes, followed by mixing, and the reaction mixture is further mixed at room temperature for 1 hour to obtain a phosphoric acid-based curing catalyst $H_3PO_4$. Although ortho-phosphoric acid contains 15 wt % of $H_2O$, it is consumed completely through the reaction with the methoxy groups ($CH_3O-$) of DMDMS as shown in the above Reaction Scheme 2. In addition, the curing catalyst $H_3PO_4$ contained in the obtained liquid has a concentration of 17.5 wt %.

(Preparation of Curable Resin Composition)

To the above viscous liquid (alkoxy oligomer), 10.00 g of the curing catalyst (phosphoric acid-based curing catalyst) is added, followed by mixing at room temperature for 10 minutes. Next, a rotary evaporator is used to remove $CH_3OH$ and $H_2O$ via distillation to obtain a transparent and homogeneous liquid (curable resin composition) containing methyl groups ($CH_3-$) as organic groups and having a molar ratio of T units:D units of 87.9:12.1. The amount of $H_3PO_4$ added as a curing catalyst is 2.30 wt % based on the combined weight of MTMS and DMDMS. In addition, the atomic ratio of O/Si is 2.9.

Example 2

100.00 g of silicone alkoxy oligomer X-40-9225 including silicone of T units alone and available from Shin-etsu Chemical Industries Co., Ltd. (organic groups: methyl groups, alkoxy groups: methoxy groups, alkoxy group content: 24 wt %, $SiO_2$ content: 67 wt %) is mixed with 3.00 g of the phosphoric acid-based curing catalyst obtained in the same manner as Example 1 at room temperature for 10 minutes to obtain a transparent and homogeneous liquid (curable resin composition) containing methyl groups ($CH_3-$) as organic groups and having a molar ratio of T units:D units of 98.2:1.8. The amount of $H_3PO_4$ added as a curing catalyst is 0.52 wt % based on the weight of the silicone alkoxy oligomer X-40-9225. In addition, the atomic ratio of O/Si is 3.0. Further, the repeating units of the silicone alkoxy oligomer X-40-9225 are analyzed by using a nuclear magnetic resonance (NMR) system JNM-ECX 400 available from Nippon Denshi Co., Ltd. to carry out NMR spectrometry ($^{29}Si$-NMR) based on $^{29}Si$.

Example 3

100.00 g of silicone alkoxy oligomer X-40-9225 is mixed with 40.00 g of the phosphoric acid-based curing catalyst obtained in the same manner as Example 1 at room temperature for 10 minutes to obtain a transparent and homogeneous liquid (curable resin composition) containing methyl groups as organic groups and having a molar ratio of T units:D units of 80.2:19.8. The amount of $H_3PO_4$ added as a curing catalyst is 7.00 wt % based on the weight of the silicone alkoxy oligomer X-40-9225. In addition, the atomic ratio of O/Si is 2.8.

Example 4

100.00 g of silicone alkoxy oligomer X-40-9246 including T units and D units at a ratio of 53.6:46.4 and available from Shin-etsu Chemical Industries Co., Ltd. (organic groups: methyl groups, alkoxy groups: methoxy groups, alkoxy group content: 12 wt %, $SiO_2$ content: 72 wt %) is mixed with 60.00 g of the phosphoric acid-based curing catalyst obtained in the same manner as Example 1 at room temperature for 10 minutes to obtain a transparent and homogeneous liquid (curable resin composition) containing methyl groups as organic groups and having a molar ratio of T units:D units of 39.9:60.1. The amount of $H_3PO_4$ added as a curing catalyst is 10.50 wt % based on the weight of the silicone alkoxy oligomer X-40-9246. In addition, the atomic ratio of O/Si is 2.4. Further, the repeating units of the silicone alkoxy oligomer X-40-9246 are analyzed by $^{29}$Si-NMR spectrometry in the same manner as Example 2.

Example 5

To a 500 mL four-necked flask equipped with a nitrogen inlet tube, Liebig condenser and a dropping funnel having a stopcock attached thereto, 47.67 g (0.35 mol) of methyl trimethoxysilane (MTMS) Z-6366 available from Toray-Dow Corning Co., Ltd., 18.03 g (0.15 mol) of dimethyl dimethoxysilane (DMDMS) Z-6329 available from Toray-Dow Corning Co., Ltd., and 32.04 g (1.00 mol) of methanol are added, followed by mixing under agitation at room temperature. Next, 13.52 g of aqueous hydrochloric acid solution is added dropwise to the above reaction mixture under agitation over 30 minutes in an amount of 3.70 mol/L of hydrochloric acid (rational formula: HCl) in such a manner that the molar ratio of HCl/(MTMS+DMDMS) is 0.1 and that of $H_2O$/(MTMS+DMDMS) is 1.5, and then agitation is further carried out for 30 minutes. Then, the four-necked flask is mounted to a mantle heater and warmed at 80° C. for 4 hours. After that, the reaction mixture is cooled to room temperature and allowed to stand for 1 hour, thereby providing a transparent and homogeneous viscous liquid (alkoxy oligomer, alkoxy group content: 16 wt %). Then, 10.00 g of the phosphoric acid-based catalyst used in Example 1 is added to the viscous liquid and mixed at room temperature for 10 minutes. After that, a rotary evaporator is used to remove $CH_3OH$ and $H_2O$ via distillation to obtain a transparent and homogeneous liquid (curable resin composition) containing methyl groups as organic groups and having a molar ratio of T units:D units of 61.6:38.4. The amount of $H_3PO_4$ added as a curing catalyst is 2.66 wt % based on the combined weight of MTMS and DMDMS. In addition, the atomic ratio of O/Si is 2.6.

Example 6

In the same manner as Example 5, 24.52 g (0.18 mol) of methyl trimethoxysilane (MTMS) Z-6366 available from Toray-Dow Corning Co., Ltd., and 38.46 g (0.32 mol) of dimethyl dimethoxysilane (DMDMS) Z-6329 available from Toray-Dow Corning Co., Ltd. are used to obtain a transparent and homogeneous alkoxy oligomer (alkoxy group content: 13 wt %). Next, 10.00 g of the phosphoric acid-based catalyst (the same catalyst as Example 1) is used for the alkoxy oligomer to obtain a transparent and homogeneous liquid (curable resin composition) containing methyl groups as organic groups and having a molar ratio of T units:D units of 31.7:68.3. The amount of $H_3PO_4$ added as a curing catalyst is 2.78 wt % based on the combined weight of MTMS and DMDMS. In addition, the atomic ratio of O/Si is 2.3.

Example 7

To 100.00 g of silicone alkoxy oligomer X-40-9246 (available from Shin-etsu Chemical Industries Co., Ltd.) warmed to 60° C., 3.00 of tetra-n-butoxyzirconium (rational formula: Zr—(O-n-$C_4H_9$)$_4$ available from Nippon Soda Co., Ltd., concentration: 85 wt %, solvent: 1-butanol, abbreviated as TBZR hereinafter) is added dropwise thereto as a curing catalyst. Next, the reaction mixture is mixed for 1 hour and cooled to room temperature to obtain a transparent and homogeneous liquid (curable resin composition) containing methyl groups as organic groups and having a molar ratio of T units:D units of 53.6:46.4. The amount of Zr—(O-n-$C_4H_9$)$_4$ added as a curing catalyst is 2.55 wt % based on the weight of the alkoxy oligomer. In addition, the atomic ratio of O/Si is 2.5.

Example 8

Example 1 is repeated, except that 75.13 g (0.5 mol) of ethyl trimethoxysilane (rational formula: $C_2H_5Si(OCH_3)_3$, molecular weight: 150.25, abbreviated as ETMS hereinafter) is used instead of methyl trimethoxysilane (MTMS) Z-6366 (available from Toray-Dow Corning Co., Ltd.) used in Example 1, thereby providing a transparent and homogeneous alkoxy oligomer (alkoxy group content: 15 wt %) in the same manner as Example 1. Next, 10.00 g of the phosphoric acid-based catalyst (the same catalyst as Example 1) is used for the alkoxy oligomer to obtain a transparent and homogeneous liquid (curable resin composition) containing ethyl groups ($C_2H_5$—) as organic groups and having a molar ratio of T units:D units of 87.9:12.1. The amount of $H_3PO_4$ added as a curing catalyst is 2.11 wt % based on the combined weight of ETMS and DMDMS. In addition, the atomic ratio of O/Si is 2.9.

Example 9

Example 7 is repeated, except that 3.00 g of pentaethoxytantalum (rational formula: Ta(OC$_2$H$_5$)$_5$) available from Hoko Chemical Industries Co., Ltd. is used instead of TBZR available from Nippon Soda Co., Ltd used as a curing catalyst in Example 7, thereby providing a transparent and homogeneous liquid (curable resin composition) containing methyl groups as organic groups and having a molar ratio of T units:D units of 53.6:46.4 in the same manner as Example 7. The amount of Ta(OC$_2$H$_5$)$_5$) added as a curing catalyst is 3.00 wt % based on the weight of the silicone alkoxy oligomer. In addition, the atomic ratio of O/Si is 2.5.

Example 10

First, 90.00 g of silicone alkoxy oligomer X-40-9246 available from Shin-etsu Chemical Industries Co., Ltd. and 10.00 g of silicone alkoxy oligomer (methyl silicate 51 (alkoxy groups: methoxy groups, alkoxy group content: 66 wt %, $SiO_2$ content: 51 wt %) including silicone of Q units alone and available from Callcott Co., Ltd. are mixed at room temperature for 1 hour under agitation. Next, 3.00 g of the phosphoric acid-based curing catalyst used in Example 1 is added thereto. Then, the reaction mixture is mixed at room temperature for 30 minutes to obtain a transparent and homogenous liquid (curable resin composition) having a ratio of Q units:T units:D units of 7.2:91.1:1.7. The amount of $H_3PO_4$ added as a curing catalyst is 0.53 wt % based on the weight of the silicone alkoxy oligomer. In addition, the atomic ratio of O/Si is 3.1.

Comparative Example 1

Example 7 is repeated, except that 3.50 g of B-1 (chemical name: tetra-n-butoxytitanium (rational formula: $Ti(O-n-C_4H_9)_4$) available from Nippon Soda Co., Ltd.) is used as a curing catalyst instead of the phosphoric acid-based curing catalyst of Example 7, thereby providing a transparent and homogeneous liquid (curable resin composition) containing methyl groups as organic groups and having a molar ratio of T units:D units of 53.6:46.4 in the same manner as Example 7. The amount of $Ti(O-n-C_4H_9)_4$ added as a curing catalyst is 3.50 wt % based on the weight of the silicone alkoxy oligomer. In addition, the atomic ratio of O/Si is 2.5.

Comparative Example 2

Example 3 is repeated, except that 6.50 g of aluminum chelate D available from Kawaken Fine Chemical Co., Ltd. (chemical name: aluminum monoacetylacetonate bis(ethylacetoacetate), rational formula: $Al(C_5H_7O_2)(C_6H_9O_3)_2$, concentration: 76 wt %, solvent: 2-propanol) is used as a curing catalyst instead of the phosphoric acid-based catalyst used in Example 3, thereby providing a transparent and homogeneous liquid (curable resin composition) containing methyl groups as organic groups and including T units alone in the same manner as Example 3. The amount of $Al(C_5H_7O_2)(C_6H_9O_3)_2$ added as a curing catalyst is 4.99 wt % based on the combined weight of the silicone alkoxy oligomers. In addition, the atomic ratio of O/Si is 3.0.

Comparative Example 3

Example 3 is repeated, except that 3.00 g of AC-540 (chemical name: zirconium tributoxy monoacetylacetonate, rational formula: $Zr(O-n-C_4H_9)_3(C_5H_7O_2)$, concentration: 45 wt %, solvent: toluene, 1-butanol, butyl acetate) is used as a curing catalyst instead of the phosphoric acid-based curing catalyst of Example 3, thereby providing a transparent and homogeneous liquid (curable resin composition) containing methyl groups as organic groups and including T units alone in the same manner as Example 3. The amount of $Zr(O-n-C_4H_9)_3(C_5H_7O_2)$ added as a curing catalyst is 1.35 wt % based on the weight of the silicone alkoxy oligomer. In addition, the atomic ratio of O/Si is 3.0.

Comparative Example 4

Example 5 is repeated to obtain a transparent and homogenous alkoxy oligomer (alkoxy group content: 12 wt %) from 14.98 g (0.11 mol) of MTMS and 46.88 g (0.39 mol) of DMDMS. Next, 10.00 g of the phosphoric acid-based catalyst used in Example 1 is used for the alkoxy oligomer to obtain a transparent and homogeneous liquid (curable resin composition) containing methyl groups as organic groups and having a molar ratio of T units:D units of 19.3:80.7. The amount of $H_3PO_4$ added as a curing catalyst is 2.83 wt % based on the combined weight of MTMS and DMDMS. In addition, the atomic ratio of O/Si is 2.2.

Comparative Example 5

Example 5 is repeated to obtain a transparent and homogenous alkoxy oligomer (alkoxy group content: 17 wt %) from 54.48 g (0.40 mol) of MTMS and 12.02 g (0.10 mol) of DMDMS. Next, 15.65 g of aqueous ortho-phosphoric acid solution ($H_3PO_4$ concentration: 85%) is used for the alkoxy oligomer instead of the phosphoric acid-based catalyst of Example 5 to obtain a transparent and homogeneous liquid (curable resin composition) containing methyl groups as organic groups and having a molar ratio of T units:D units of 80.0:20.0. The amount of $H_3PO_4$ added as a curing catalyst is 20.00 wt % based on the combined weight of MTMS and DMDMS. In addition, the atomic ratio of O/Si is 2.8.

[Evaluation and Determination]

Each of the curable resin compositions according to Examples 1-10 and Comparative Examples 1-5 is evaluated and determined for cracking, breaking, transmission and UV resistance. The results are shown in the following Tables 1-4.

(Evaluation for Cracking and Breaking)

To a schale made of polymethylpentene resin and having an inner diameter ϕ of 84 mm and a height of 14 mm, 6.0 g of each sealant (curable resin composition) is cast. Next, the schale is covered with its cover made of polymethylpentene resin (inner diameter ϕ of 87 mm and a height of 8 mm) and allowed to stand at room temperature to carry out solidification. Evaluation for solidification is carried out by locating the end of the schale on a metal block having a height of 20 mm and tilting the schale (about 13°) to determine whether the liquid in the schale is flowable or not. After solidification, the cover is removed, and then the schale is allowed to stand at room temperature and determined whether cracking and breaking occurs or not with the naked eyes. In addition, the evaluation results are shown in Tables 1-4 in the line of 'Cracking and Breaking', wherein no cracking and breaking is represented by 'none' and occurrence of cracking and breaking is represented by 'yes'.

(Measurement and Evaluation for Transmission)

To a schale made of polymethylpentene resin and having an inner diameter ϕ of 84 mm and a height of 14 mm, 6.0 g of each sealant (curable resin composition) is cast in an amount capable of providing a solidified product with a thickness of 1 mm. Next, the schale is covered with its cover made of polymethylpentene resin (inner diameter ϕ of 87 mm and a height of 8 mm) to carry out solidification. After solidification, the sealant is heated to 150° C. and maintained at 150° C. for 1 hour to carry out drying. The resultant solidified product is determined for its transmission by using UV-VIS spectrometer U-4100 available from Hitachi Technologies Co., Ltd. in a wavelength range of 200-1200 nm. In addition, it is determined for its minimum transmission in a wavelength range of 300-350 nm.

FIG. 3-FIG. 6 are graphs showing the results of transmission determination. FIG. 3 is a graph illustrating the results of transmission of the curable resin composition according to Example 3, FIG. 4 is a graph illustrating the results of transmission of the curable resin composition according to Example 7, FIG. 5 is a graph illustrating the results of transmission of the curable resin composition according to Example 9, and FIG. 6 is a graph illustrating the results of transmission of the curable resin composition according to Example 10. In Example 3, the minimum transmission in a wavelength range of 300-350 nm is evaluated as 91.8% from FIG. 3. In Example 7, the minimum transmission in a wavelength range of 300-350 nm is evaluated as 90.5% from FIG. 4. In Example 9, the minimum transmission in a wavelength range of 300-350 nm is evaluated as 87.4% from FIG. 5. In Example 10, the minimum transmission in a wavelength range of 300-350 nm is evaluated as 91.1% from FIG. 6. After the minimum transmission in a wavelength range of 300-350 nm is obtained from the results of transmission determination for each sealant (curable resin composition) as described above, it is shown in Tables 1-4 as 'Tmin$_{300\text{-}350}$'. In addition, when a sealant has a 'Tmin$_{300\text{-}350}$' of 85% or more, it is judged as 'passed'.

(Evaluation for UV Resistance)

A package type UV LED:NC4U133B (light emission peak wavelength: 365 nm) from which the glass window is removed is mounted to an aluminum-made star substrate. Next, the star substrate is fixed to an aluminum-made heat sink with a screw through a spacer made of Teflon (trade mark). Then, the package type UV LED is subjected to application of an electric current of 1.0 A to emit UV rays with about 100 W/cm$^2$. In addition, the thickness of the spacer made of Teflon (trade mark) is adjusted so that the junction temperature (Tj) may be 100° C. The junction temperature is determined by using a thermal resistance determination system AT-205 available from UASA Electronics Co., Ltd. Each sealant (curable resin composition) is filled into the concave portion of the package type UV LED and allowed to stand at room temperature so that it is solidified. Then, the sealant is warmed to 150° C. and maintained at 150° C. for 1 hour to carry out drying. The sealed package type UV LED is subjected to application of an electric current of 1.0 A and the light is on/off continuously. The luminous intensity is determined continuously by using an integrating sphere (available from Labsphere, Model No. 3P-GPS-020-SL, inner diameter: φ 2 inches). To determine luminous intensity, a UV integral light counter UIT-150 and a light collector for a UV integral light counter UVD-S365 are used. Since an LED tends to undergo degradation of luminous intensity as the lapse of lighting time, determination of UV resistance of a sealant (curable resin composition) is carried out by lighting on/off a non-sealed package type UV LED continuously together with a sealed package type UV LED and comparing the luminous intensity of the former with that of the latter over 5000 hours. In addition, as described hereinafter, determination of UV resistance includes determining a luminous intensity (corrected value) after 500 hours, luminous intensity (corrected value) after 1000 hours and a luminous intensity after 5000 hours, and judging a sealant providing a luminous intensity (corrected value) of at least 85% after 500 hours as 'passed'.

FIG. 7-FIG. 9 is a graph illustrating a change in luminous intensity with time. FIG. 7 is a graph illustrating a change in luminous intensity with time of the curable resin composition according to Example 1, FIG. 8 is a graph illustrating a change in luminous intensity with time of the curable resin composition according to Example 3, and FIG. 9 is a graph illustrating a change in luminous intensity with time of the curable resin composition according to Example 7. In FIG. 7-FIG. 9, a graph represented by 'o' and a dotted line is one illustrating a change (measured value) in luminous intensity with time and includes a relative value of luminous intensity based on the luminous intensity of an LED right after lighting, taken as 100%. In addition, In FIG. 7-FIG. 9, a graph represented by '•' and a solid line shows a measured value represented by 'o' and a dotted line, after its correction (corrected value) considering the luminous intensity of a non-sealed package type UV LED. Particularly, a graph represented by '•' and a solid line (i.e., corrected value) shows a ratio of luminous intensity of the UV rays passing through the solidified product of each sealant (curable resin composition) based on the luminous intensity of a non-sealed package type UV LED, i.e., transmission of the solidified product of each sealant (curable resin composition) to UV rays.

In Example 1, the luminous intensity (corrected value) after 500 hours is evaluated as 95% or more, luminous intensity (corrected value) after 1000 hours is evaluated as 95% or more, and the luminous intensity (corrected value) after 5000 hours is evaluated as 90% or more, as determined from FIG. 7. In Example 3, the luminous intensity (corrected value) after 500 hours is evaluated as 95% or more, luminous intensity (corrected value) after 1000 hours is evaluated as 95% or more, and the luminous intensity (corrected value) after 5000 hours is evaluated as 90% or more, as determined from FIG. 8. In Example 7, the luminous intensity (corrected value) after 500 hours is evaluated as 95% or more, luminous intensity (corrected value) after 1000 hours is evaluated as 95% or more, and the luminous intensity (corrected value) after 5000 hours is evaluated as 90% or more, as determined from FIG. 9. After the luminous intensity of an LED sealed with each sealant (curable resin composition) is determined as described above, the results of the luminous intensity (corrected value) after 500 hours, luminous intensity (corrected value) after 1000 hours, and the luminous intensity (corrected value) after 5000 hours are shown in Tables 1-4 as UV Resistance (1) (luminous intensity (corrected value) after 500 hours), UV Resistance (2) (luminous intensity (corrected value) after 1000 hours), and UV Resistance (3) (luminous intensity (corrected value) after 5000 hours). In addition, referring to the evaluation criteria for UV resistance, a luminous intensity (corrected value) after at least 500 hours of 85% or more is judged as 'passed'. However, the evaluation criteria for UV resistance is variable according to the options required for an LED, 87.5% or more being preferred, 90% or more being more preferred. In addition, the evaluation criteria for UV resistance may further include a luminous intensity (corrected value) after 1000 hours (i.e., UV transmission after 1000 hours). In this case, a luminous intensity (corrected value) after 1000 hours of 85% or more is preferred, 87.5% or more being more preferred, 90% or more being even more preferred. In addition, the evaluation criteria for UV resistance may further include a luminous intensity (corrected value) after 5000 hours (i.e., UV transmission after 5000 hours). In this case, a luminous intensity (corrected value) after 5000 hours of 80% or more is preferred, 85% or more being more preferred, 90% or more being even more preferred. As shown in Tables 3 and 4, in Comparative Examples 1-7, UV Resistance (1) (luminous intensity (corrected value) after 500 hours) and UV Resistance (2) (luminous intensity (corrected value) after 1000 hours) are evaluated as 85% or less, and thus UV Resistance (3) (luminous intensity (corrected value) after 5000 hours) is not evaluated.

TABLE 1

|  |  | Example 1 | Example 2 | Example 3 | Example 4 | Example 5 |
| --- | --- | --- | --- | --- | --- | --- |
| Composition | Q Units | 0.0 | 0.0 | 0.0 | 0.0 | 0.0 |
|  | T Units | 87.9 | 98.2 | 80.2 | 39.9 | 61.6 |
|  | D Units | 12.1 | 1.8 | 19.8 | 60.1 | 38.4 |
|  | Total | 100.0 | 100.0 | 100.0 | 100.0 | 100.0 |
| O/Si |  | 2.9 | 3.0 | 2.8 | 2.4 | 2.6 |
| Organic groups |  | methyl groups | methyl groups | methyl groups | methyl groups | methyl groups |
| Alkoxy group content |  | 19 wt % | 24 wt % | 24 wt % | 12 wt % | 16 wt % |
| Curing catalyst | Type | $H_3PO_4$ | $H_3PO_4$ | $H_3PO_4$ | $H_3PO_4$ | $H_3PO_4$ |
|  | Amount | 2.30% | 0.53% | 7.00% | 10.50% | 2.66% |
| Cracking and Breaking |  | None | None | None | None | None |
| $Tmin_{300-350}$ |  | 92.5% | 93.1% | 91.8% | 92.0% | 92.2% |
| UV Resistance (1) |  | 95% or more | 95% or more | 95% or more | 95% or more | 95% or more |
| UV Resistance (2) |  | 95% or more | 95% or more | 95% or more | 95% or more | 95% or more |
| UV Resistance (3) |  | 90% or more | 90% or more | 90% or more | 90% or more | 90% or more |

TABLE 2

|  |  | Example 6 | Example 7 | Example 8 | Example 9 | Example 10 |
| --- | --- | --- | --- | --- | --- | --- |
| Composition | Q Units | 0.0 | 0.0 | 0.0 | 0.0 | 7.2 |
|  | T Units | 31.7 | 53.6 | 87.9 | 53.6 | 91.1 |
|  | D Units | 68.3 | 46.4 | 12.1 | 46.4 | 1.7 |
|  | Total | 100.0 | 100.0 | 100.0 | 100.0 | 100.0 |
| O/Si |  | 2.3 | 2.5 | 2.9 | 2.5 | 3.1 |
| Organic groups |  | methyl groups | methyl groups | methyl groups | methyl groups | methyl groups |
| Alkoxy group content |  | 13 wt % | 12 wt % | 15 wt % | 12 wt % | 12 wt % |
| Curing catalyst | Type | $H_3PO_4$ | $Zr(O-n-C_4H_9)_4$ | $H_3PO_4$ | $Ta(OC_2H_5)_5$ | $H_3PO_4$ |
|  | Amount | 2.78% | 2.55% | 2.11% | 3.00% | 0.53% |
| Cracking and Breaking |  | None | None | None | None | None |
| $Tmin_{300-350}$ |  | 92.1% | 90.5% | 92.2% | 87.4% | 91.1% |
| UV Resistance (1) |  | 90% or more | 95% or more | 95% or more | 95% or more | 95% or more |
| UV Resistance (2) |  | 90% or more | 95% or more | 95% or more | 95% or more | 95% or more |
| UV Resistance (3) |  | 90% or more | 90% or more | 90% or more | 90% or more | 90% or more |

TABLE 3

|  |  | Comp. Ex. 1 | Comp. Ex. 2 | Comp. Ex. 3 |
| --- | --- | --- | --- | --- |
| Composition | Q Units | 0.0 | 0.0 | 0.0 |
|  | T Units | 53.6 | 100.0 | 100.0 |
|  | D Units | 46.4 | 0.0 | 0.0 |
|  | Total | 100.0 | 100.0 | 100.0 |
| O/Si |  | 2.5 | 3.0 | 3.0 |
| Organic groups |  | methyl groups | methyl groups | methyl groups |
| Alkoxy group content |  | 12 wt % | 24 wt % | 24 wt % |
| Curing catalyst | Type | $Ti(O-n-C_4H_9)_4$ | $Al(C_5H_7O_2)(C_6H_9O_3)_2$ | $Zr(O-n-C_4H_9)_3(C_5H_7O_2)$ |
|  | Amount | 3.50% | 4.94% | 1.35% |
| Cracking and Breaking |  | None | None | None |
| $Tmin_{300-350}$ |  | 2.3% | 0.0% | 1.2% |
| UV Resistance (1) |  | less than 80% | less than 80% | less than 80% |
| UV Resistance (2) |  | less than 80% | less than 80% | less than 80% |
| UV Resistance (3) |  | not evaluated | not evaluated | not evaluated |

TABLE 4

|  |  | Comp. Ex. 4 | Comp. Ex. 5 |
|---|---|---|---|
| Composition | Q Units | 0.0 | 0.0 |
|  | T Units | 19.3 | 80.0 |
|  | D Units | 80.7 | 20.0 |
|  | Total | 100.0 | 100.0 |
| O/Si |  | 2.2 | 2.8 |
| Organic groups |  | methyl groups | methyl groups |
| Alkoxy group content |  | 12 wt % | 17 wt % |
| Curing catalyst | Type | $H_3PO_4$ | $H_3PO_4$ |
|  | Amount | 2.83% | 20.0% |
| Cracking and Breaking |  | None | None |
| $Tmin_{300-350}$ |  | 90.3% | 90.7% |
| UV Resistance (1) |  | less than 70% | less than 85% |
| UV Resistance (2) |  | less than 70% | less than 85% |
| UV Resistance (3) |  | not evaluated | not evaluated |

(Discussion)

As shown in Tables 1 and 2, each of the sealants (curable resin compositions) according to examples 1-8 has an atomic ratio of O/Si of 2.3-3.5 and uses a curing catalyst including 3-30 parts by weight of phosphoric acid based on 100 parts by weight of alkoxy oligomer, or 0.5-20 parts by weight of alkoxide of at least one metal selected from the group consisting of B, Al, P, Sc, Ga, Y, Zr, Nb, In, Sn, La, Gd, Dy, Yb, Hf, Ta and W. Thus, each sealant causes no cracking or breaking after curing, has a '$Tmin_{300-350}$' of 85% or more, and shows a 'luminous intensity (corrected value) after 500 hours' (i.e. UV resistance (1)) of 85% or more. As a result, it can be seen that each of the sealants (curable resin compositions) according to Examples 1-8 has excellent transparency in the UV region, UV resistance and heat resistance.

FIG. 10 shows the transmission characteristics of the curable resin composition obtained by using tetra-n-butoxytitanium as a curing catalyst according to Comparative Example 1. As shown in FIG. 10, tetra-n-butoxytitanium according to Comparative Example 1 contains Ti and absorbs light in a wavelength range lower than 350 nm. Due to this, when using it as a curing catalyst, it causes degradation of transmission characteristics in the UV region and UV resistance (Table 3), and thus is not suitable for a curing catalyst.

FIG. 11 shows the transmission characteristics of the curable resin composition obtained by using aluminum monoacetylacetonate bis(ethylacetoacetate) according to Comparative Example 2. As shown in FIG. 11, a metal chelate compound such as aluminum monoacetylacetonate bis(ethylacetoacetate) absorbs light in a wavelength range lower than 350 nm. Due to this, when using it as a curing catalyst, it causes degradation of transmission characteristics in the UV region and UV resistance (Table 3), and thus is not suitable for a curing catalyst.

FIG. 12 shows the transmission characteristics of the curable resin composition obtained by using zirconium tributoxymonoacetylacetonate according to Comparative Example 3. As shown in FIG. 12, zirconium tributoxymonoacetylacetonate also absorbs light in a wavelength range lower than 350 nm. Due to this, when using it as a curing catalyst, it causes degradation of transmission characteristics in the UV region and UV resistance (Table 3), and thus is not suitable for a curing catalyst.

As can be seen from Comparative Example 4, a relative increase in D units and a decrease in ratio of T units/(D units+T units) result in an atomic ratio of O/Si lower than 2.3, leading to degradation of UV resistance (Table 4).

As can be seen from Comparative Example 5, use of an excessively large amount of catalyst provides an excessively hard raw material, and thus causes significant degradation of an ability of relieving the stress generated by a change in temperature caused by light on/off of an LED, resulting in degradation of UV resistance (Table 4).

While the exemplary embodiments have been shown and described, it will be understood by those skilled in the art that various changes in form and details may be made thereto without departing from the scope of this disclosure as defined by the appended claims.

For example, although the above described embodiments include use of a curable resin composition for sealing a UV LED, use of the curable resin composition is not limited thereto but may include use as a sealant material for a light emitting device for use in the other semiconductor light emitting devices (optical semiconductor devices), light detectors, electro-optical displays, organic semiconductors, organic light emitting diodes, electro-luminescence displays, organic solar cell devices, light devices, or the like.

Therefore, the above-described embodiments are for illustrative purposes only and are non-limiting. In addition, it is intended that the scope of the present invention includes all embodiments falling within the spirit and scope of the appended claims.

The invention claimed is:

1. A curable resin composition comprising an alkoxy oligomer and a curing catalyst, wherein the alkoxy oligomer has an organopolysiloxane structure, and has (a) a repeating unit represented by the following Formula 2 in combination with at least one repeating unit selected from the group consisting of a repeating unit represented by the following Formula 5, when a is 1, and a repeating unit represented by the following Formula 6 and/or (b) a repeating unit represented by the following Formula 3 in combination with a repeating unit represented by the following Formula 5, when a is 2:

Formula 2

$$(R^4R^5SiO_{2/2}) \qquad (2),$$

where each of $R^4$ and $R^5$ independently represents the same or a different organic group, Formula 3

$$(R^6SiO_{3/2}) \qquad (3),$$

where $R^6$ is an organic group,

Formula 5

$$(R^7{}_a(OR^8)_{3-a}SiO_{1/2}) \qquad (5),$$

where a is 1 or 2, each of $R^7$ and $R^8$ independently represents the same or a different organic group, and when two or more $R^7$s or $R^8$s are present, each $R^7$ or $R^8$ may be the same or different, and Formula 6

$$(R^9{}_b(OR^{10})_{2-b}SiO_{2/2}) \qquad (6),$$

where b is 1, each of $R^9$ and $R^{10}$ independently represents the same or a different organic group, wherein the repeating units represented by Formulas 2, 3, 5, and/or 6 are present in an amount of 90-100 mol % based on 100 mol % of the total siloxane units forming the alkoxy oligomer, the atomic ratio of the total amount of O atoms based on the total amount of Si atoms contained in the alkoxy oligomer is 2.3-3.5, the curing catalyst is phosphoric acid present in an amount of 0.1-17.5 parts by weight based on 100 parts by weight of the alkoxy oligomer or alkoxide of at least one metal selected from the group consisting of B, Al, P, Sc, Ga, Y, Zr, Nb, In, Sn, La, Gd, Dy, Yb, Hf, Ta, and W, present in an amount of 0.5-20 part by weight based on 100 parts by weight of the alkoxy oligomer, the curable resin composition comprises T units of 39.9 to 91.1 mol %, and the alkoxy groups are present in the alkoxy oligomer in an amount of 10 to 30 mass %.

2. The curable resin composition according to claim 1, wherein the alkoxy oligomer and the curing catalyst comprise no sulfur atom or nitrogen atom.

3. The curable resin composition according to claim 1, wherein $R^4$, $R^5$, $R^6$, $R^7$, $R^8$, $R^9$, and $R^{10}$ represent methyl groups.

4. The curable resin composition according to claim 2, wherein $R^4$, $R^5$, $R^6$, $R^7$, $R^8$, $R^9$, and $R^{10}$ represent methyl groups.

5. The curable resin composition according to claim 1, wherein the curing catalyst comprises no Ti Compound or chelate compound.

6. The curable resin composition according to claim 2, wherein the curing catalyst comprises no Ti Compound or chelate compound.

7. The curable resin composition according to claim 1, wherein the alkoxy oligomer is present in a liquid state at room temperature.

8. The curable resin composition according to claim 2, wherein the alkoxy oligomer is present in a liquid state at room temperature.

9. The curable resin composition according to claim 1, wherein when UV rays having a predetermined wavelength are irradiated to the solidified product obtained by curing the curable resin composition at a luminous intensity of about 100 W/cm$^2$ for 500 hours, the solidified product has a UV transmission of at least 85%.

10. The curable resin composition according to claim 2, wherein when UV rays having a predetermined wavelength are irradiated to the solidified product obtained by curing the curable resin composition at a luminous intensity of about 100 W/cm$^2$ for 500 hours, the solidified product has a UV transmission of at least 85%.

11. The curable resin composition according to claim 9, wherein when UV rays are irradiated for 1000 hours to the solidified product, the solidified product has a UV transmission of at least 85%.

12. The curable resin composition according to claim 10, wherein when UV rays are irradiated for 1000 hours to the solidified product, the solidified product has a UV transmission of at least 85%.

13. The curable resin composition according to claim 11, when UV rays are irradiated for 5000 hours to the solidified product, the solidified product has a UV transmission of at least 80%.

14. The curable resin composition according to claim 12, when UV rays are irradiated for 5000 hours to the solidified product, the solidified product has a UV transmission of at least 80%.

15. The curable resin composition according to claim 9, wherein the predetermined wavelength is about 365 nm.

16. The curable resin composition according to claim 10, wherein the predetermined wavelength is about 365 nm.

17. An optical semiconductor system having an optical semiconductor device sealed with the curable resin composition as defined in claim 1.

18. An optical semiconductor system having an optical semiconductor device sealed with the curable resin composition as defined in claim 2.

19. The optical semiconductor system according to claim 17, wherein the optical semiconductor device emits light in the ultraviolet region.

20. The optical semiconductor system according to claim 18, wherein the optical semiconductor device emits light in the ultraviolet region.

* * * * *